(12) United States Patent
Fukami et al.

(10) Patent No.: US 9,105,831 B2
(45) Date of Patent: Aug. 11, 2015

(54) NONVOLATILE MAGNETIC ELEMENT AND NONVOLATILE MAGNETIC DEVICE

(75) Inventors: Shunsuke Fukami, Tokyo (JP); Daichi Chiba, Kyoto (JP)

(73) Assignees: NEC CORPORATION, Tokyo (JP); KYOTO UNIVERSITY, Kyoto (JP)

( * ) Notice: Subject to any disclaimer, the term of this patent is extended or adjusted under 35 U.S.C. 154(b) by 0 days.

(21) Appl. No.: 14/234,547

(22) PCT Filed: Jun. 13, 2012

(86) PCT No.: PCT/JP2012/065674
§ 371 (c)(1),
(2), (4) Date: Feb. 5, 2014

(87) PCT Pub. No.: WO2012/173279
PCT Pub. Date: Dec. 20, 2012

(65) Prior Publication Data
US 2014/0159121 A1   Jun. 12, 2014

(30) Foreign Application Priority Data

Jun. 16, 2011   (JP) .................................. 2011-133897

(51) Int. Cl.
*H01L 29/82* (2006.01)
*H01L 43/02* (2006.01)
*H01L 43/08* (2006.01)
(Continued)

(52) U.S. Cl.
CPC .............. *H01L 43/02* (2013.01); *G11C 11/161* (2013.01); *H01L 27/228* (2013.01); *H01L 43/08* (2013.01); *H01L 29/82* (2013.01)

(58) Field of Classification Search
USPC ................................................. 257/421, 422
See application file for complete search history.

(56) References Cited

U.S. PATENT DOCUMENTS

| 6,625,058 B2 | 9/2003 | Iwasaki |
| 2003/0012050 A1 | 1/2003 | Iwasaki |

(Continued)

FOREIGN PATENT DOCUMENTS

| JP | 2003-007980 | 1/2003 |
| JP | 2004-179219 | 6/2004 |

(Continued)

OTHER PUBLICATIONS

International Search Report, PCT/JP2012/065674, Aug. 14, 2012.

(Continued)

*Primary Examiner* — Errol Fernandes
(74) *Attorney, Agent, or Firm* — Young & Thompson

(57) ABSTRACT

Provided is a nonvolatile magnetic device that is capable of realizing low power consumption by performing writing with a voltage and is also excellent in retention characteristics. The nonvolatile magnetic device includes a nonvolatile magnetic element. The nonvolatile magnetic element includes: a first free layer made of a ferromagnetic substance; a first insulating layer made of an insulator, the first insulating layer being provided to be connected to the first free layer; a charged layer provided adjacent to the first insulating layer; a second insulating layer made of an insulator, the second insulating layer being provided adjacent to the charged layer; and an injection layer provided adjacent to the second insulating layer. The charged layer is smaller in electric resistivity than both of the first insulating layer and the second insulating layer. The injection layer is smaller in electric resistivity than the second insulating layer.

20 Claims, 32 Drawing Sheets

(51) Int. Cl.
*H01L 27/22* (2006.01)
*G11C 11/16* (2006.01)

(56) References Cited

U.S. PATENT DOCUMENTS

| | | | |
|---|---|---|---|
| 2007/0085068 A1* | 4/2007 | Apalkov et al. | 257/1 |
| 2011/0049659 A1 | 3/2011 | Suzuki et al. | |
| 2011/0076784 A1* | 3/2011 | Druist et al. | 438/3 |
| 2013/0250670 A1* | 9/2013 | Nakai et al. | 365/158 |
| 2014/0043895 A1* | 2/2014 | Bibes | 365/171 |
| 2014/0056060 A1* | 2/2014 | Khvalkovskiy et al. | 365/158 |
| 2015/0041934 A1* | 2/2015 | Khvalkovskiy et al. | 257/421 |

FOREIGN PATENT DOCUMENTS

| | | |
|---|---|---|
| JP | 2006-286713 | 10/2006 |
| JP | 2010-212342 | 9/2010 |
| JP | 2011-124462 | 6/2011 |
| WO | WO 2009/133650 | 11/2009 |
| WO | WO 2010/032574 | 3/2010 |

OTHER PUBLICATIONS

D. Chiba et al., "Electricial Manipulation of Magnetization Reversal in a Ferromagnetic Seimiconductor", Science 301, p. 943 (2003); DOI: 10.1126/science, 1086608.

Shiota et al., "Voltage-Assisted Magnetization Switching in Ultrathin Fe80Co20 Alloy Layers", Applied Physics Express 2 (2009) p. 063001.

Tsujikawa et al., "Finite Electric Field Effects in the Large Perpendicular Magnetic Anisotropy Surface Pt/Fe/Pt(001): A First-Principles Study", Physical Review Letters, vol. 102, p. 247203 (2009).

* cited by examiner

IN1="1", IN2="0"

IN1="1", IN2="1"

NONVOLATILE MAGNETIC ELEMENT AND NONVOLATILE MAGNETIC DEVICE

TECHNICAL FIELD

This invention relates to a nonvolatile magnetic element and a nonvolatile magnetic device. In particular, this invention relates to a nonvolatile magnetic memory element and a magnetic memory device for writing information by a voltage, and to a nonvolatile logic circuit capable of changing a logic configuration by a voltage.

BACKGROUND ART

A promising means for breaking the limit of scaling in semiconductor memories for large scale integrated circuits (LSIs), such as a static random access memory (SRAM) and a dynamic random access memory (DRAM), is replacement of an existing semiconductor memory with a nonvolatile memory. The proposed specific nonvolatile memories include a phase-change random access memory (PRAM), a resistive random access memory (ReRAM), and a magnetic random access memory (MRAM). In particular, the MRAM is a memory for storing information based on a magnetization direction of a magnetic substance. The MRAM is superior to other memories in terms of high-speed operation, and is therefore expected to be replace an existing work memory.

Although the MRAM has been put into practical use in a limited market, the primary challenge to be addressed for enlarging the market in the future is to reduce a write current. The reason is that a larger write current leads to an increased size of a cell transistor for driving a cell, with the result that the cell size becomes larger to increase bit cost. A large write current is not preferred also in terms of power consumption during operation.

A write method for the MRAM in practical use at present involves the use of the Oersted magnetic field, which is induced by a current introduced in wiring, to switch the magnetization of a memory element arranged in the vicinity of the Oersted magnetic field. This method, however, uses a current of several milliamperes (mA), and the write current becomes still larger when the design rule is smaller. This is not preferred in terms of application to a leading-edge CMOS generation.

A promising method for reducing the write current in the MRAM is a method using spin-transfer torque induced by a current, and has been actively studied and developed. The feature of the method using spin-transfer torque resides in introducing a current directly into a magnetic substance rather than introducing a current into metal wiring arranged in the vicinity of the magnetic substance. As the specific method, there have been proposed an MRAM element in which current-induced magnetization switching is used for writing and an MRAM element in which current-induced domain wall motion is used for writing. In both the MRAM elements, the write current is reduced along with miniaturization in element size. In other words, the write current is scalable. It is therefore expected that write operation be achieved with a remarkable small current as compared to the conventional method using the Oersted magnetic field. However, any of those methods is not different from the method using the Oersted magnetic field in terms of using a current for writing.

By the way, in recent years, it has been reported that magnetic properties of a ferromagnetic substance, such as the magnitudes of magnetic anisotropy and saturation magnetization, may be modulated with the use of a voltage instead of a magnetic field or a current (see Non Patent Literature 1 and Non Patent Literature 2). If a voltage can be used for writing instead of a current, power consumption in writing can be remarkably suppressed. An MRAM for performing writing with the use of a voltage is disclosed in Patent Literature 1.

PRIOR ART LITERATURE

Patent Literature

Patent Literature 1: Japanese Unexamined Patent Application Publication (JP-A) No. 2003-7980

Non Patent Literature

Non-Patent Literature 1: Science, vol. 301, p. 943 (2003).
Non-Patent Literature 2: Applied Physics Express, vol. 2, p. 063001 (2009).
Non-Patent Literature 3: Physical Review Letters, vol. 102, p. 247203 (2009).

DISCLOSURE OF THE INVENTION

Problem to be Solved by the Invention

For the MRAM disclosed in Patent Literature 1, however, although there is a description of a method of changing the magnetization direction of a magnetic substance with the use of a voltage, there is no description of a method of retaining the magnetization direction of the magnetic substance even after the change by a voltage. In other words, it is difficult to realize sufficient retention characteristics necessary as a nonvolatile memory.

This invention provides a nonvolatile memory element that is capable of realizing low power consumption by performing writing with a voltage and is also excellent in retention characteristics.

This invention further provides a nonvolatile magnetic device that is capable of realizing low power consumption by performing writing with a voltage and is also excellent in retention characteristics.

This invention further provides a magnetic memory device (MRAM) that is capable of realizing low power consumption by performing writing with a voltage and is also excellent in retention characteristics.

This invention further provides a nonvolatile logic circuit capable of changing a logic configuration by a voltage and retaining the changed logic configuration in a nonvolatile manner.

Means to Solve the Problem

According to this invention, there is provided a nonvolatile magnetic element, comprising: a first insulating layer including an insulator; a first free layer including a ferromagnetic substance, the first free layer being formed on one side of the first insulating layer; a charged layer for accumulating an electric charge, the charged layer being formed on another side of the first insulating layer and opposed to the first free layer; a second insulating layer including an insulator, the second insulating layer being formed on one side of the charged layer and opposed to the first insulating layer; and an injection layer formed on one side of the second insulating layer and opposed to the charged layer, in which the charged layer is smaller in electric resistivity than both of the first insulating layer and the second insulating layer, and the injection layer is smaller in electric resistivity than the second insulating layer.

According to one embodiment of this invention, the nonvolatile magnetic element further comprises: a third insulating layer including an insulator; and a reference layer including a ferromagnetic substance, the reference layer being formed on one side of the third insulating layer. The reference layer and the first free layer are arranged on opposite sides with respect to the third insulating layer.

According to one embodiment of this invention, the injection layer is connected to a first terminal, the first free layer is connected to a second terminal, and any one of the reference layer and the charged layer is connected to a third terminal.

According to one embodiment of this invention, the first free layer includes a first region having a variable magnetization direction and a second region having a fixed magnetization direction.

According to one embodiment of this invention, the injection layer includes a source region, a channel region, and a drain region.

According to one embodiment of this invention, the charged layer includes a ferromagnetic substance, and has magnetization having a fixed direction.

According to one embodiment of this invention, the nonvolatile magnetic element further includes a second free layer formed on another side of the third insulating layer and opposed to the reference layer.

According to one embodiment of this invention, the nonvolatile magnetic element further includes a bias layer including a ferromagnetic substance, for applying a magnetic flux to the first free layer.

Further, according to this invention, there is provided a nonvolatile magnetic device that includes a nonvolatile magnetic element including: a first insulating layer including an insulator; a first free layer including a ferromagnetic substance, the first free layer being formed on one side of the first insulating layer; a charged layer for accumulating an electric charge, the charged layer being formed on another side of the first insulating layer and opposed to the first free layer; a second insulating layer formed on one side of the charged layer and opposed to the first insulating layer; and an injection layer formed on one side of the second insulating layer and opposed to the charged layer, in which the charged layer is smaller in electric resistivity than both of the first insulating layer and the second insulating layer, and the injection layer is smaller in electric resistivity than the second insulating layer.

According to one embodiment of this invention, there is obtained a magnetic memory device in which a nonvolatile magnetic memory element is used as the nonvolatile magnetic element.

According to another embodiment of this invention, there is obtained a logic circuit in which a nonvolatile magnetic logic element is used as the nonvolatile magnetic element.

Effect of the Invention

The nonvolatile magnetic element according to this invention performs writing by a voltage. Writing is performed based on the accumulation of electric charges in the charged layer, and a current to be consumed in writing is vanishingly small. Consequently, writing can be performed with significantly small power consumption. On the other hand, the TMR effect is used in reading, and hence an access time comparable to that in the conventional MRAM can be realized.

The nonvolatile magnetic device according to this invention includes the nonvolatile magnetic element according to this invention. Consequently, in the case where the nonvolatile magnetic device is a magnetic memory device, a magnetic memory device having significantly low power consumption while maintaining a fast random access frequency can be provided.

The nonvolatile magnetic device according to this invention includes the nonvolatile magnetic element according to this invention. Consequently, in the case where the nonvolatile magnetic device is a logic circuit, a logic circuit capable of changing a logic configuration by a voltage and retaining a result of logic operation in a nonvolatile manner can be obtained.

MODE FOR EMBODYING THE INVENTION

Specific embodiments of a nonvolatile magnetic device according to this invention include a magnetic memory device and a logic circuit. A nonvolatile magnetic element is used for the nonvolatile magnetic device according to the embodiment. A nonvolatile magnetic memory element is used for a nonvolatile magnetic element used in the magnetic memory device. The nonvolatile magnetic memory element is herein referred to also simply as "magnetic memory element". A nonvolatile magnetic element used in the logic circuit is a nonvolatile magnetic logic element. The nonvolatile magnetic logic element is herein referred to also simply as "magnetic logic element".

A detailed description is herein given mainly of a magnetic memory device. The magnetic memory device according to this invention includes a plurality of magnetic memory cells arranged in an array, and each magnetic memory cell includes a magnetic memory element (nonvolatile magnetic memory element). This invention relates to the structure of the magnetic memory device.

First Embodiment (Structure)

Figure 1:
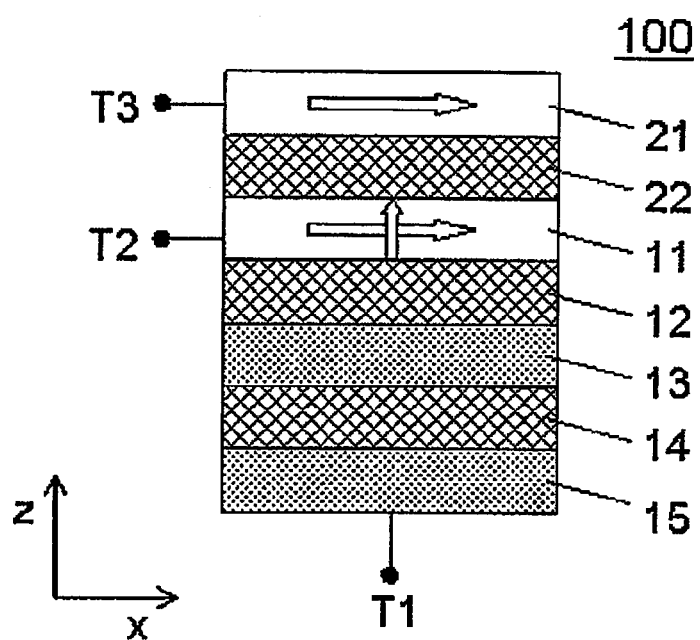
FIG. 1 is a cross-sectional diagram schematically illustrating a representative structure of a magnetic memory element 100 according to an embodiment of this invention.

FIG. 1 is a cross-sectional diagram schematically illustrating a representative structure of magnetic memory element 100 according to this embodiment. In FIG. 1, the x axis is a direction parallel to the substrate and the z axis is a direction perpendicular to the substrate.

Magnetic memory element 100 according to this embodiment includes at least first free layer 11, first insulating layer (referred to also as "first non-magnetic layer") 12, charged layer 13, second insulating layer (referred to also as "second non-magnetic layer") 14, and injection layer 15. The laminate structure of those layers is formed on a substrate (not shown). In the description of this embodiment, the layers are formed on the upper side of the substrate. However, the layers may be laminated on the lower side of the substrate. Although not always required, reference layer 21 and third insulating layer 22 are provided. The structure in which reference layer 21 and third insulating layer (referred to also as "third non-magnetic layer") 22 are not provided is described later.

First free layer 11 is made of a ferromagnetic substance. First free layer 11 has magnetization having a variable direction. The first free layer can be referred to also as "magnetized free layer" or "free magnetic layer".

First insulating layer 12 is made of an insulator. First insulating layer 12 is provided to be electrically connected to first free layer 11. In the example illustrated in FIG. 1, first insulating layer 12 is provided adjacent to first free layer 11. Note that, first insulating layer 12 only needs to be provided to be electrically connected to first free layer 11, and is not always required to be provided adjacent to first free layer 11. The example in which first insulating layer 12 is not provided adjacent to first free layer 11 is described later.

Charged layer 13 is made of a material having a lower electric resistance than those of first insulating layer 12 and second insulating layer 13 to be described below. For example, charged layer 13 is made of a conductor. Charged layer 13 is provided adjacent to first insulating layer 12 and on the side opposite to first free layer 11.

Second insulating layer 14 is made of an insulator. Second insulating layer 14 is provided adjacent to charged layer 13 and on the side opposite to first insulating layer 13.

Injection layer 15 is made of a material having a lower electric resistance than that of second insulating layer 14. Injection layer 15 is provided adjacent to second insulating layer 14 and on the side opposite to charged layer 13.

Third insulating layer 22 is made of an insulator. Third insulating layer 22 is provided adjacent to first free layer 11 and on the side opposite to first insulating layer 12.

Reference layer 21 is made of a ferromagnetic substance. Reference layer 21 is provided adjacent to third insulating layer 22 and on the side opposite to first free layer 11. Reference layer 21 has magnetization having a magnetization direction fixed in one direction.

In other words, in the magnetic memory element according to this embodiment, typically, reference layer 21, third insulating layer 22, first free layer 11, first insulating layer 12, charged layer 13, second insulating layer 14, and injection layer 15 are provided and laminated in this order.

Above-mentioned first free layer 11, first insulating layer 12, charged layer 13, second insulating layer 14, injection layer 15, reference layer 21, and third insulating layer 22 may each be a laminate film including a plurality of layers, unless the functions to be described later are impaired.

Injection layer 15 is connected to a circuit constructing magnetic memory cell 110 to be described later via first terminal T1. First free layer 11 is connected to the circuit constructing magnetic memory cell 110 via second terminal T2. Reference layer 21 is connected to the circuit constructing magnetic memory cell 110 via third terminal T3. Note that, a conductive layer may be inserted between injection layer 15 and first terminal T1, between first free layer 11 and second terminal T2, or between reference layer 21 and third terminal T3. As described above, magnetic memory element 100 is typically an element having three or more terminals.

(Memory State)

A description is next given of a memory state of magnetic memory element 100 according to this embodiment.

Magnetic memory element 100 according to this embodiment stores information based on the presence/absence of electric charges accumulated in charged layer 13 or the sign of the electric charges. In other words, the presence/absence of electric charges in charged layer 13 or the sign of the electric charges corresponds to information to be stored.

Figure 2A:
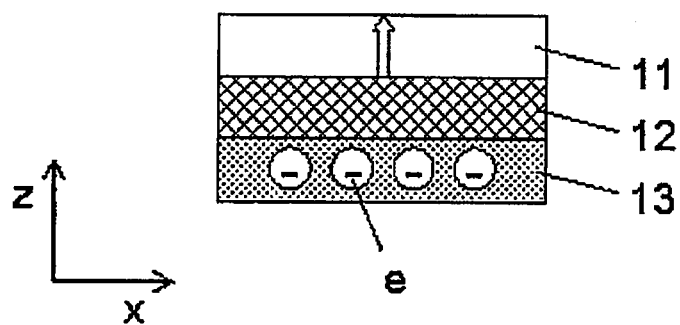
FIG. 2A is a cross-sectional diagram conceptually illustrating a memory state (1) of the magnetic memory element 100 according to the embodiment, and illustrates a "0" state.
Figure 2B:
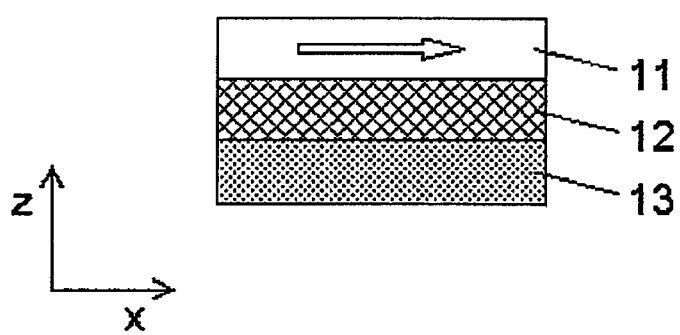
FIG. 2B is a cross-sectional diagram conceptually illustrating the memory state (1) of the magnetic memory element 100 according to the embodiment, and illustrates a "1" state.

FIGS. 2A and 2B are cross-sectional diagrams conceptually illustrating the memory state of magnetic memory element 100 according to this embodiment. For simplicity, only first free layer 11, first insulating layer 12, and charged layer 13 are illustrated in FIGS. 2A and 2B.

FIG. 2A schematically illustrates the states of charged layer 13 and first free layer 11 in a "0" state, and FIG. 2B schematically illustrates the states of charged layer 13 and first free layer 11 in a "1" state. In the "0" state of FIG. 2A, electrons e are accumulated in charged layer 13. Then, the magnetization of first free layer 11 is oriented in the +z direction by an electric field generated by the electrons e accumulated in charged layer 13. In the "1" state of FIG. 2B, on the other hand, the electrons e are not accumulated in charged layer 13. In this case, no electric field is applied to first free layer 11, and the magnetization is oriented in the +x direction. It is the feature of this embodiment that the magnetization direction of first free layer 11 changes correspondingly to the presence/absence and sign of electric charges accumulated in charged layer 13 as described above.

The electrical and magnetic configurations in the memory state of magnetic memory element 100 according to this embodiment are not limited to those illustrated in FIGS. 2A and 2B.

Figure 3A:
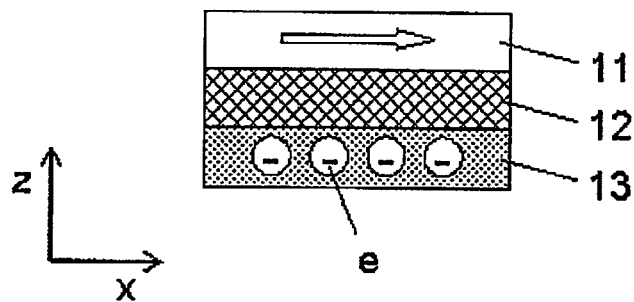
FIG. 3A is a cross-sectional diagram conceptually illustrating a memory state (2) of the magnetic memory element 100 according to the embodiment, and illustrates the "0" state.
Figure 3B:
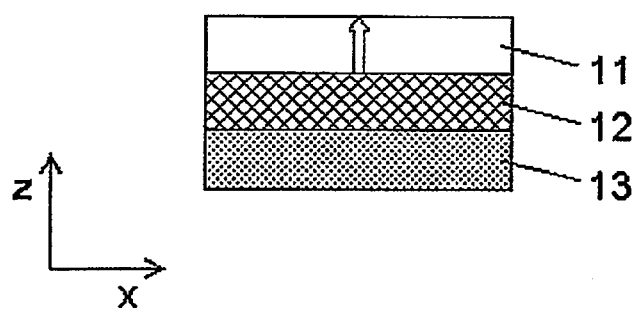
FIG. 3B is a cross-sectional diagram conceptually illustrating the memory state (2) of the magnetic memory element 100 according to the embodiment, and illustrates the "1" state.

For example, memory information may be stored by electric and magnetic configurations illustrated in FIGS. 3A and 3B. In a "0" state illustrated in FIG. 3A, electrons e are accumulated in charged layer 13, and the magnetization of first free layer 11 is oriented in the +x direction by an electric field formed by the accumulated electrons e. In a "1" state illustrated in FIG. 3B, on the other hand, no electric charges are accumulated in charged layer 13, and the magnetization of first free layer 11 is oriented in the +z direction.

Figure 4A:
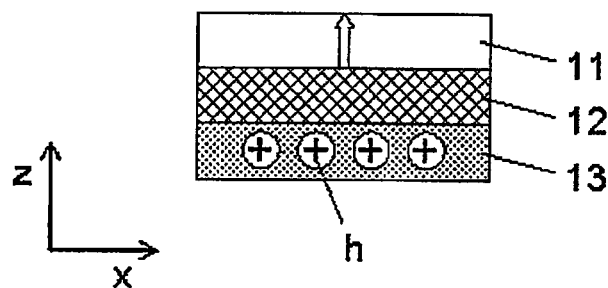
FIG. 4A is a cross-sectional diagram conceptually illustrating a memory state (3) of the magnetic memory element 100 according to the embodiment, and illustrates the "0" state.
Figure 4B:
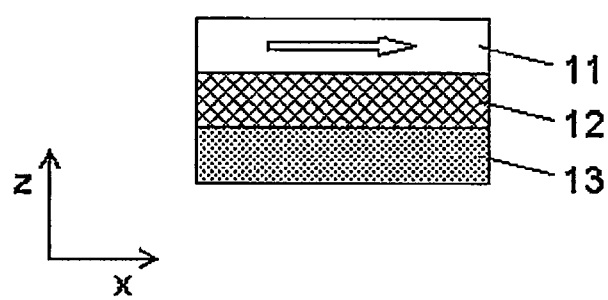
FIG. 4B is a cross-sectional diagram conceptually illustrating the memory state (3) of the magnetic memory element 100 according to the embodiment, and illustrates the "1" state.

Alternatively, for example, memory information may be stored by electric and magnetic configurations illustrated in FIGS. 4A and 4B. In a "0" state illustrated in FIG. 4A, holes h are accumulated in charged layer 13, and the magnetization of first free layer 11 is oriented in the +z direction by an electric field formed by the accumulated holes h. In a "1" state illustrated in FIG. 4B, on the other hand, no electric charges are accumulated in charged layer 13, and the magnetization of first free layer 11 is oriented in the +x direction.

Figure 5A:
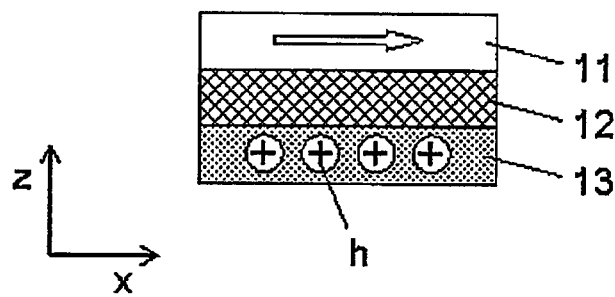
FIG. 5A is a cross-sectional diagram conceptually illustrating a memory state (4) of the magnetic memory element 100 according to the embodiment, and illustrates the "0" state.
Figure 5B:
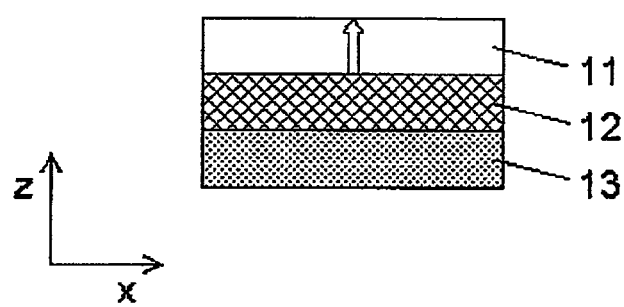
FIG. 5B is a cross-sectional diagram conceptually illustrating the memory state (4) of the magnetic memory element 100 according to the embodiment, and illustrates the "1" state.

Alternatively, for example, memory information may be stored by electric and magnetic configurations illustrated in FIGS. 5A and 5B. In a "0" state illustrated in FIG. 5A, holes h are accumulated in charged layer 13, and the magnetization of first free layer 11 is oriented in the +x direction by an electric field formed by the accumulated holes h. In a "1" state illustrated in FIG. 5B, on the other hand, no electric charges are accumulated in charged layer 13, and the magnetization of first free layer 11 is oriented in the +z direction.

Figure 6A:
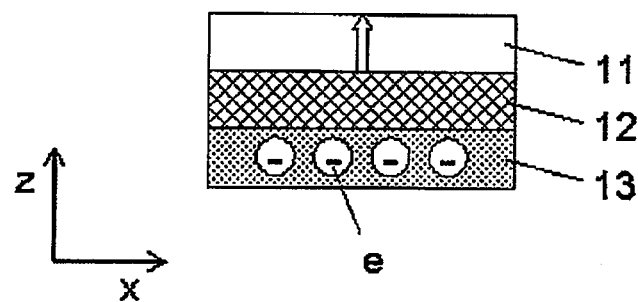
FIG. 6A is a cross-sectional diagram conceptually illustrating a memory state (5) of the magnetic memory element 100 according to the embodiment, and illustrates the "0" state.
Figure 6B:
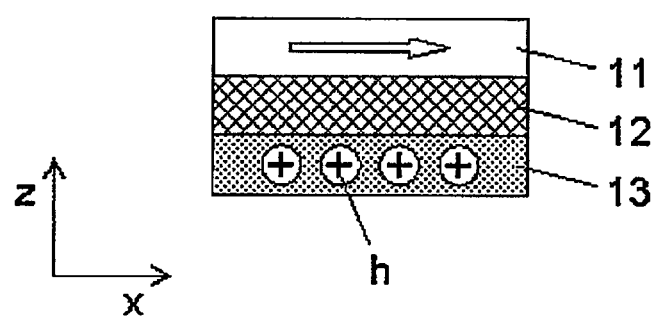
FIG. 6B is a cross-sectional diagram conceptually illustrating the memory state (5) of the magnetic memory element 100 according to the embodiment, and illustrates the "1" state.

Alternatively, for example, memory information may be stored by electric and magnetic configurations illustrated in FIGS. 6A and 6B. In a "0" state illustrated in FIG. 6A, electrons e are accumulated in charged layer 13, and the magnetization of first free layer 11 is oriented in the +z direction by an electric field formed by the accumulated electrons e. In a "1" state illustrated in FIG. 6B, on the other hand, holes h are accumulated in charged layer 13, and the magnetization of first free layer 11 is oriented in the +x direction by an electric field formed by the accumulated holes h.

Figure 7A:
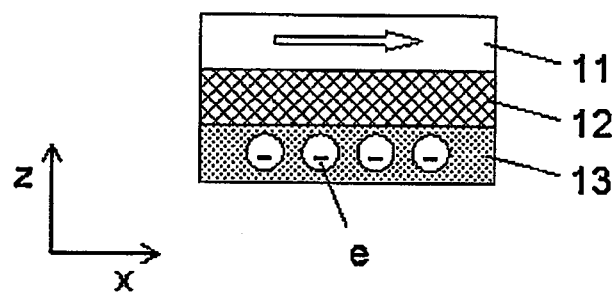
FIG. 7A is a cross-sectional diagram conceptually illustrating a memory state (6) of the magnetic memory element 100 according to the embodiment, and illustrates the "0" state.
Figure 7B:
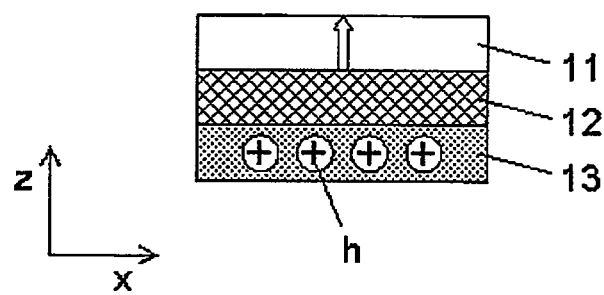
FIG. 7B is a cross-sectional diagram conceptually illustrating the memory state (6) of the magnetic memory element 100 according to the embodiment, and illustrates the "1" state.

Alternatively, for example, memory information may be stored by electric and magnetic configurations illustrated in FIGS. 7A and 7B. In a "0" state illustrated in FIG. 7A, electrons e are accumulated in charged layer 13, and the magnetization of first free layer 11 is oriented in the +x direction by an electric field formed by the accumulated electrons e. In a "1" state illustrated in FIG. 7B, on the other hand, holes h are accumulated in charged layer 13, and the magnetization of first free layer 11 is oriented in the +z direction by an electric field formed by the accumulated holes h.

Figure 8A:
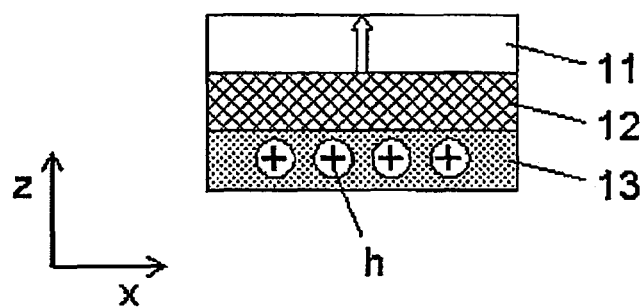
FIG. 8A is a cross-sectional diagram conceptually illustrating a memory state (7) of the magnetic memory element 100 according to the embodiment, and illustrates the "0" state.
Figure 8B:
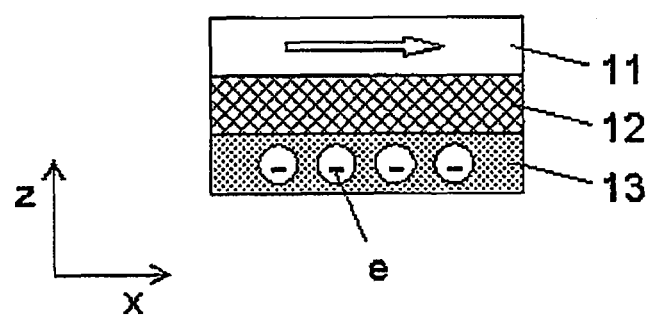
FIG. 8B is a cross-sectional diagram conceptually illustrating the memory state (7) of the magnetic memory element 100 according to the embodiment, and illustrates the "1" state.

Alternatively, for example, memory information may be stored by electric and magnetic configurations illustrated in FIGS. 8A and 8B. In a "0" state illustrated in FIG. 8A, holes h are accumulated in charged layer 13, and the magnetization of first free layer 11 is oriented in the +z direction by an electric field formed by the accumulated holes h. In a "1" state illustrated in FIG. 8B, on the other hand, electrons e are accumulated in charged layer 13, and the magnetization of first free layer 11 is oriented in the +x direction by an electric field formed by the accumulated electrons e.

Figure 9A:
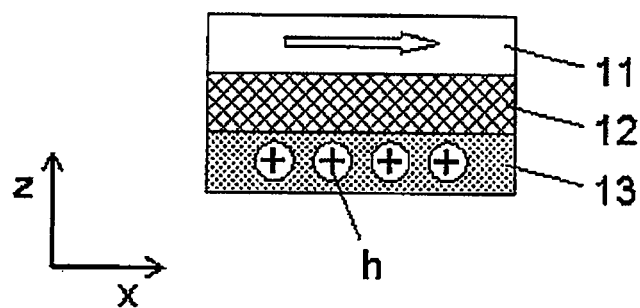
FIG. 9A is a cross-sectional diagram conceptually illustrating a memory state (8) of the magnetic memory element 100 according to the embodiment, and illustrates the "0" state.
Figure 9B:
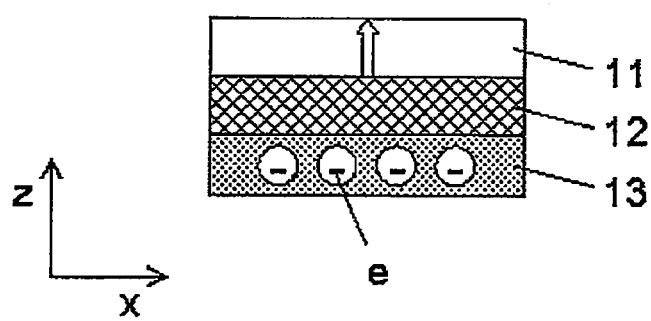
FIG. 9B is a cross-sectional diagram conceptually illustrating the memory state (8) of the magnetic memory element 100 according to the embodiment, and illustrates the "1" state.

Alternatively, for example, memory information may be stored by electric and magnetic configurations illustrated in FIGS. 9A and 9B. In a "0" state illustrated in FIG. 9A, holes h are accumulated in charged layer 13, and the magnetization of first free layer 11 is oriented in the +x direction by an electric field formed by the accumulated holes h. In a "1" state illustrated in FIG. 7B, on the other hand, electrons e are accumulated in charged layer 13, and the magnetization of first free layer 11 is oriented in the +z direction by an electric field formed by the accumulated electrons e.

As described above, there is arbitrariness in the relationship between the presence/absence of electric charges in charged layer 13 and the sign of the electric charges and the direction of magnetization of first free layer 11. Thus, the relationship can be freely designed by a manufacturer depending on the material of first free layer 11 and the entire structure.

Note that, in FIGS. 2A and 2B to FIGS. 9A and 9B, the magnetization of first free layer 11 is illustrated as being completely parallel to the +x or +z direction, but, in actuality, the magnetization of first free layer 11 only needs to have a +x component or a +z component. The magnetization direction in the +x direction and the magnetization direction in the +z direction are not always required to be different by 90 degrees.

(Read Method)

Referring to FIGS. 10A and 10B to FIGS. 13A and 13B, a description is next given of a method of reading information stored in magnetic memory element 100 according to this embodiment.

Magnetic memory element 100 according to this embodiment reads information by using a tunnel magneto-resistance effect (TMR effect) in a magnetic tunnel junction (MTJ) formed by first free layer 11, third insulating layer 22, and reference layer 21. FIGS. 10A and 10B to FIGS. 13A and 13B are cross-sectional diagrams schematically illustrating examples of the specific read methods. Note that, in FIGS. 10A and 10B to FIGS. 13A and 13B, the direction of magnetization of first free layer 11 is illustrated as being oriented in the +z direction in the "0" state and in the +x direction in the "1" state as illustrated in FIGS. 2A and 2B. The correspondence between the direction of magnetization of first free layer 11 and information to be stored is not limited to the above as illustrated in FIGS. 3A and 3B to FIGS. 9A and 9B. However, the read methods in those cases are evident and hence descriptions thereof are omitted.

Figure 10A:
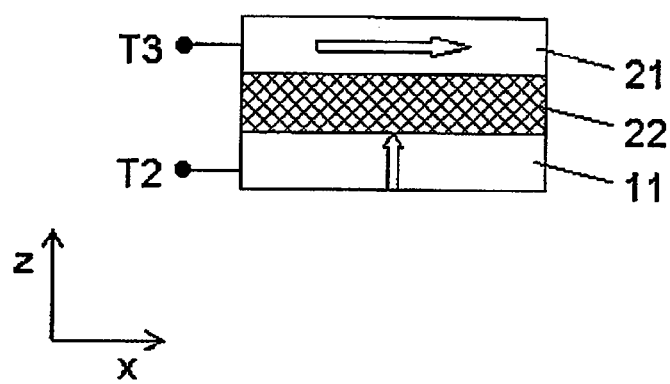
FIG. 10A is a cross-sectional diagram for illustrating a read method (1) according to the embodiment.
Figure 10B:
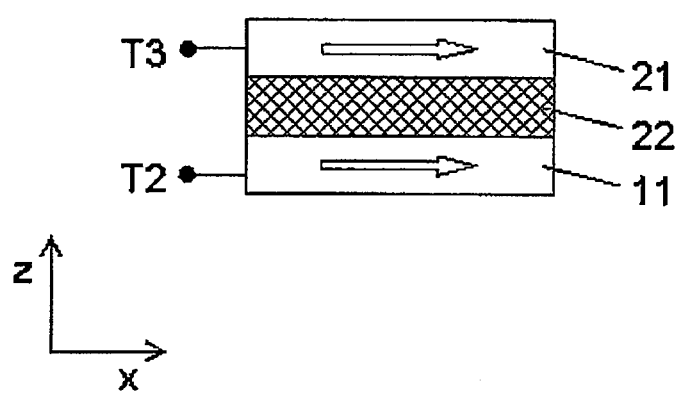
FIG. 10B is another cross-sectional diagram for illustrating the read method (1) according to the embodiment.

In the example illustrated in FIGS. 10A and 10B, reference layer 21 has magnetization fixed in the +x direction. In this case, in the "1" state illustrated in FIG. 10B, the magnetization of first free layer 11 and the magnetization of reference layer 21 become parallel to each other to realize a low resistance state. In the "0" state illustrated in FIG. 10A, on the other hand, the magnetization of first free layer 11 and the magnetization of reference layer 21 become perpendicular to each other to realize a high resistance state.

Even when the magnetization configurations illustrated in FIGS. 11A and 11B to FIGS. 13A and 13B are used, the direction of magnetization of first free layer 11 can be read as a resistance difference in the MTJ by using the TMR effect.

Figure 11A:
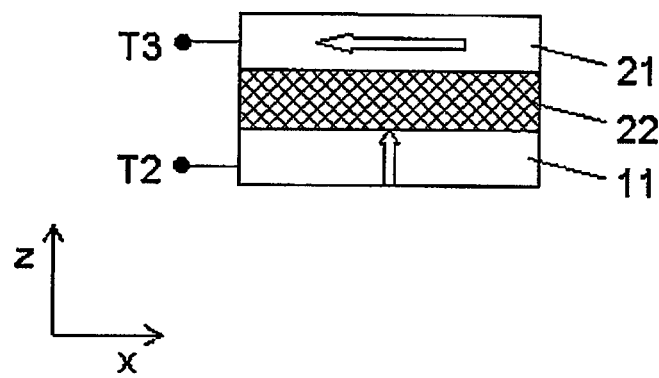
FIG. 11A is a cross-sectional diagram for illustrating a read method (2) according to the embodiment.
Figure 11B:
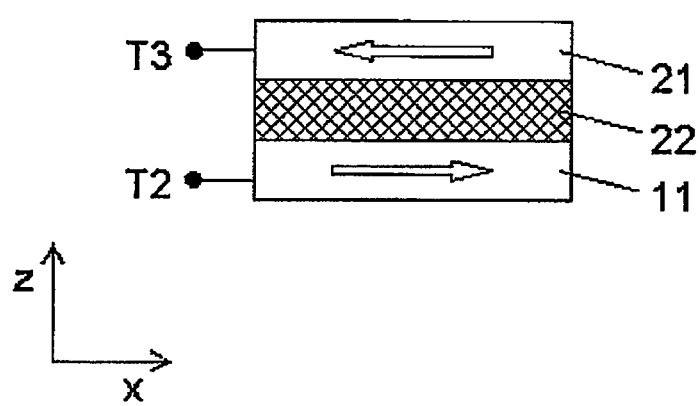
FIG. 11B is another cross-sectional diagram for illustrating the read method (2) according to the embodiment.

In FIGS. 11A and 11B, the magnetization of reference layer 11 is fixed in the −x direction. In this case, in the "0" state illustrated in FIG. 11A, the magnetization of first free layer 11 and the magnetization of reference layer 21 become perpendicular to each other. In the "1" state illustrated in FIG. 11B, on the other hand, the magnetization of first free layer 11 and the magnetization of reference layer 21 become anti-parallel to each other. Thus, the former becomes a low resistance state and the latter becomes a high resistance state.

Figure 12A:
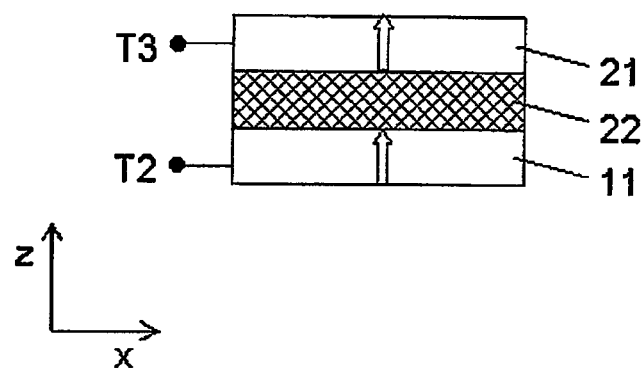
FIG. 12A is a cross-sectional diagram for illustrating a read method (3) according to the embodiment.
Figure 12B:
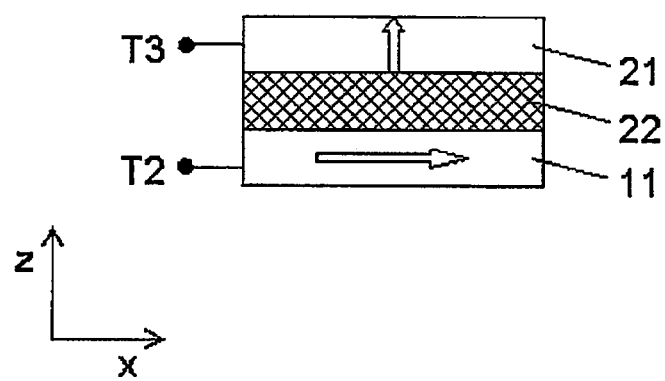
FIG. 12B is another cross-sectional diagram for illustrating the read method (3) according to the embodiment.

In FIGS. 12A and 12B, the magnetization of reference layer 11 is fixed in the +z direction. In this case, in the "0" state illustrated in FIG. 12A, the magnetization of first free layer 11 and the magnetization of reference layer 21 become parallel to each other. In the "1" state illustrated in FIG. 12B, on the other hand, the magnetization of first free layer 11 and the magnetization of reference layer 21 become perpendicular to each other. Thus, the former becomes a low resistance state and the latter becomes a high resistance state.

Figure 13A:
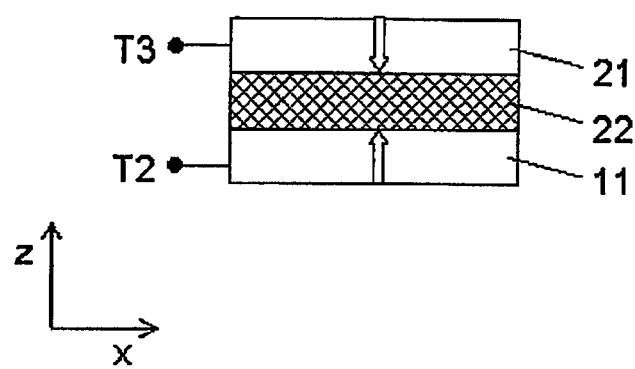
FIG. 13A is a cross-sectional diagram for illustrating a read method (4) according to the embodiment.
Figure 13B:
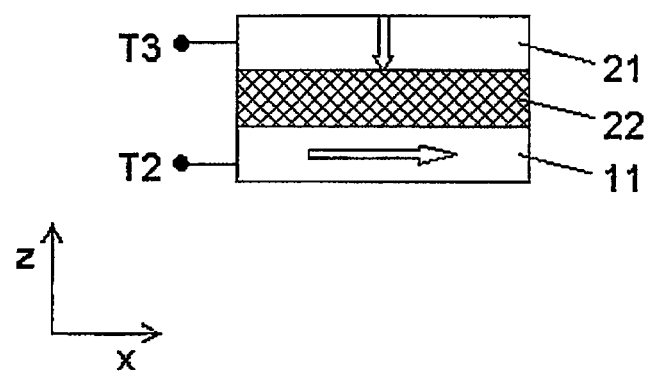
FIG. 13B is another cross-sectional diagram for illustrating the read method (4) according to the embodiment.

In FIGS. 13A and 13B, the magnetization of reference layer 11 is fixed in the −z direction. In this case, in the "0" state illustrated in FIG. 13A, the magnetization of first free layer 11 and the magnetization of reference layer 21 become anti-parallel to each other. In the "1" state illustrated in FIG. 13B, on the other hand, the magnetization of first free layer 11 and the magnetization of reference layer 21 become perpendicular to each other. Thus, the former becomes a high resistance state and the latter becomes a low resistance state.

In this manner, which of the "0" state and the "1" state is set to the parallel configuration, the vertical configuration, or the anti-parallel configuration and which of the "0" state and the "1" state is set to the low resistance state or the high resistance state can be arbitrarily designed depending on the direction of the fixed magnetization of reference layer 11.

(Write Method)

Referring to FIGS. 14A and 14B and FIGS. 15A and 15B, a description is next given of a method of writing information into magnetic memory element 100 according to this embodiment.

Magnetic memory element 100 according to this embodiment writes information by charging and discharging electric charges into and from charged layer 13 with the use of injection layer 15. FIGS. 14A, 14B, 15A, and 15B schematically illustrate the specific write methods.

Figure 14A:
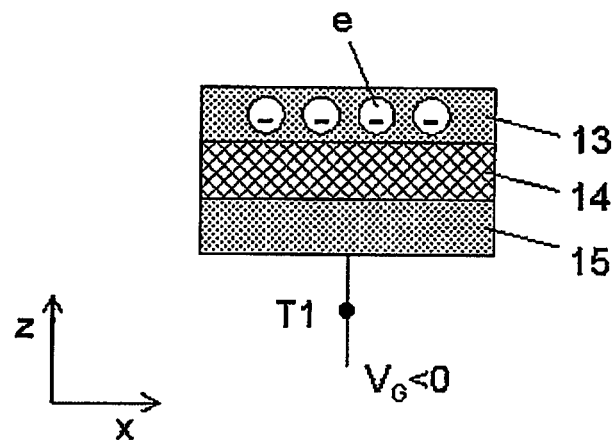
FIG. 14A is a cross-sectional diagram for illustrating a write method (1) according to the embodiment.
Figure 14B:
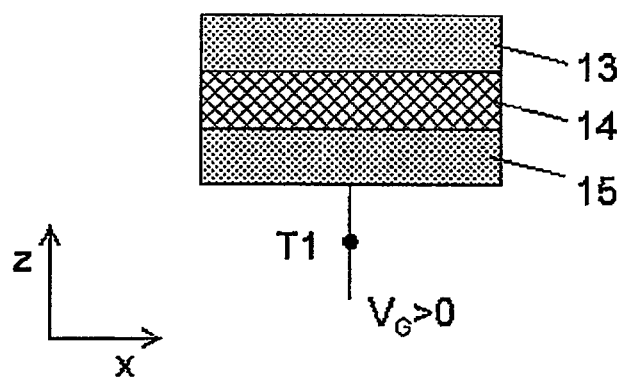
FIG. 14B is another cross-sectional diagram for illustrating the write method (1) according to the embodiment.

In the method illustrated in FIGS. 14A and 14B, "0" is written by applying a negative voltage to injection layer 15 as illustrated in FIG. 14A. In this case, electrons flow from injection layer 15 to charged layer 13 through the TMR effect, and electrons e are accumulated in charged layer 13. On the other hand, "1" is written by applying a positive voltage to injection layer 15 as illustrated in FIG. 14B. In this case, electrons flow from charged layer 13 to injection layer 15 through the TMR effect, and the electrons e of charged layer 13 are discharged.

Figure 15A:
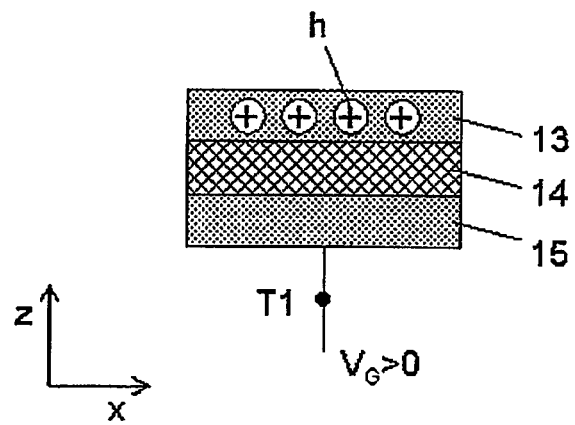
FIG. 15A is a cross-sectional diagram for illustrating a write method (2) according to the embodiment.
Figure 15B:
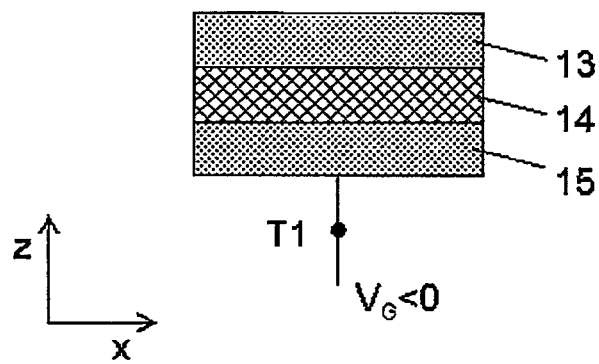
FIG. 15B is another cross-sectional diagram for illustrating the write method (2) according to the embodiment.

Alternatively, in the method illustrated in FIGS. 15A and 15B, "0" is written by applying a positive voltage to injection layer 15 as illustrated in FIG. 15A. In this case, electrons e flow from charged layer 13 to injection layer 15 through the TMR effect, and holes h are accumulated in charged layer 13. On the other hand, "1" is written by applying a negative voltage to injection layer 15 as illustrated in FIG. 14B. In this case, electrons flow from injection layer 15 to charged layer 13 through the TMR effect, and the holes h of charged layer 13 are discharged.

In this manner, by applying positive and negative voltages to injection layer 15 to control the amount of electric charges accumulated in charged layer 13 and the sign of electric charges, information can be written into magnetic memory element 100.

Although FIGS. 14A and 14B and FIGS. 15A and 15B illustrate the write methods with the use of a tunnel current that flows between injection layer 15 and charged layer 13 via second insulating layer 14, information may be written by another method using a tunnel current that flows between charged layer 13 and first free layer 11 via first insulating layer 12. Besides, those methods may be combined.

In addition, there is another available method of accumulating electric charges into charged layer 13 without using a tunnel current between injection layer 15 and charged layer 13 or a tunnel current between charged layer 13 and first free layer 11. The specific method is described later.

(Principle)

Figure 16A:
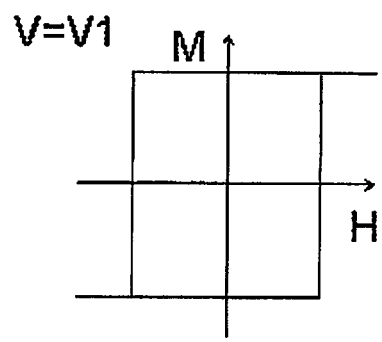
FIG. 16A schematically shows a magnetization curve measured when a voltage V1 is applied to a ferromagnetic substance.
Figure 16B:
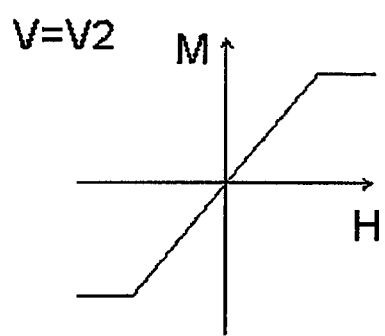
FIG. 16B schematically shows a magnetization curve measured when a voltage V2 is applied to a ferromagnetic substance.

Referring to FIGS. 16A and 16B, a description is next given of the principle used in a method of operating magnetic memory element 100 according to this embodiment.

In magnetic memory element 100 according to this embodiment, a modulation effect of magnetic anisotropy based on a voltage is used for writing and retention of information. FIGS. 16A and 16B conceptually show the modulation effect of magnetic anisotropy based on a voltage.

FIGS. 16A and 16B schematically show magnetization curves measured when voltage V1 and voltage V2 are applied to ferromagnetic substances, respectively. The following description assumes that the horizontal axis of those magnetization curves is a magnetic field in the direction perpendicular to the substrate, but may be a magnetic field in the direction parallel to the substrate.

It is known that, when a voltage is applied to an appropriately designed ferromagnetic substance, the magnetic anisotropy of the ferromagnetic substance changes. In this embodiment, first free layer 11 uses a material and a configuration in which the change in magnetic anisotropy is large and the direction of anisotropy changes. Specifically, for example, when voltage V1 is applied as shown in FIG. 16A, the magnetic anisotropy is imparted in the direction perpendicular to the substrate, and the magnetization is oriented in the direction perpendicular to the substrate at a zero magnetic field. When voltage V2 is applied as shown in FIG. 16B, on the other hand, the magnetic anisotropy is imparted in the in-plane direction of the substrate, and the magnetization has a vertical component of zero at a zero magnetic field and is oriented in the direction parallel to the substrate. In other words, the magnetization of first free layer 11 changes its direction at a zero magnetic field depending on a voltage (electric field) applied from the outside.

In this embodiment, this electric field is generated by electric charges accumulated in charged layer 13. In other words, the electric field induced at the position of first free layer 11 changes depending on the presence/absence and sign of electric charges accumulated in charged layer 13, and the direction of magnetization of first free layer 11 changes accordingly. Then, the direction of magnetization is read by the MTJ formed of reference layer 21, third non-magnetic layer 22, and first free layer 11. In other words, information is stored based on the accumulation of electric charges in charged layer 13, and a voltage is used for writing instead of using a current. The magnetic memory device is similar to a DRAM and a flash memory in this regard. On the other hand, the TMR effect is used to read information. The magnetic memory device is similar to an MRAM in this regard.

Note that, it is known that a ferromagnetic substance changes its direction and magnitude of magnetic anisotropy and also its saturation magnetization value and its electron structure relating to a spin polarization rate depending on an applied voltage. Thus, in this embodiment, it is not always necessary to use the direction of magnetic anisotropy as a parameter that changes depending on an external electric field in first free layer 11. For example, the saturation magnetization and the electron structure may be used. The change in saturation magnetization or electron structure is reflected in the TMR effect similarly to the above-mentioned principle, and hence reading can be performed with a similar MTJ structure.

(Circuit Configuration)

A description is next given of a circuit configuration for introducing a write voltage and a read current into magnetic memory cell 110 including magnetic memory element 100 according to this embodiment.

Figure 17:
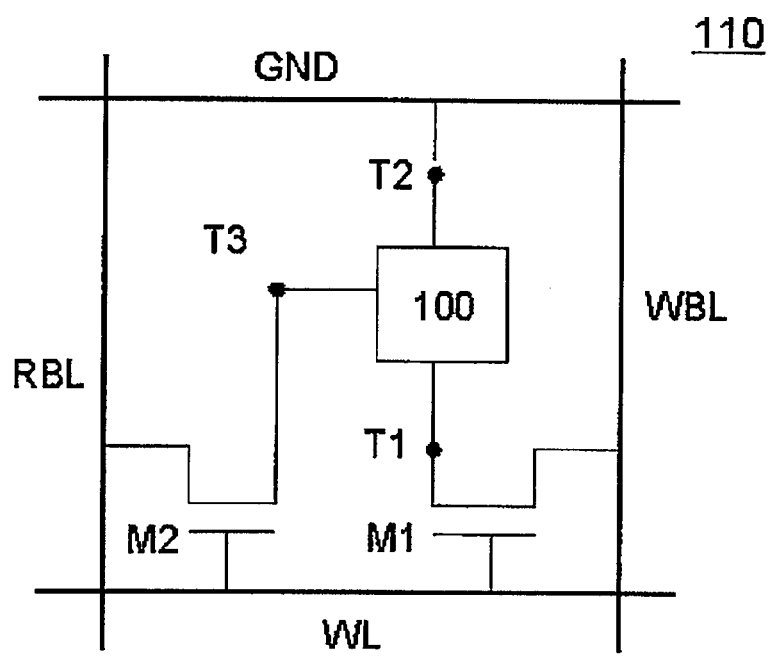
FIG. 17 is a circuit diagram illustrating a configuration example of a circuit for 1 bit of a magnetic memory cell 110 according to the embodiment.

FIG. 17 illustrates a configuration example of a circuit for 1 bit of magnetic memory cell 110. In the example illustrated in FIG. 17, magnetic storage element 100 is a three-terminal element, and is connected to first MOS transistor M1, second MOS transistor, word line WL, ground line GND, write bit line WBL, and read bit line RBL. Specifically, first terminal T1 connected to injection layer 15 is connected to write bit line WBL via MOS transistor M1, and a gate of the MOS transistor M1 is connected to the word line WL. A second terminal T2 connected to first free layer 11 is connected to ground line GND, and third terminal T3 connected to reference layer 21 is connected to read bit line RBL.

In data writing, word line WL is set to High level, and first MOS transistor M1 is turned ON. Further, the voltage of write bit line WBL is set to an appropriate value. In this manner, the voltage of first terminal T1 is properly set to perform data writing.

In data reading, word line WL is set to High level, and second MOS transistor M2 is turned ON. Further, read bit line RBL is set to an appropriate potential. In this manner, a current flows between second terminal T2 and third terminal T3 to perform reading using the TMR effect.

Figure 18:
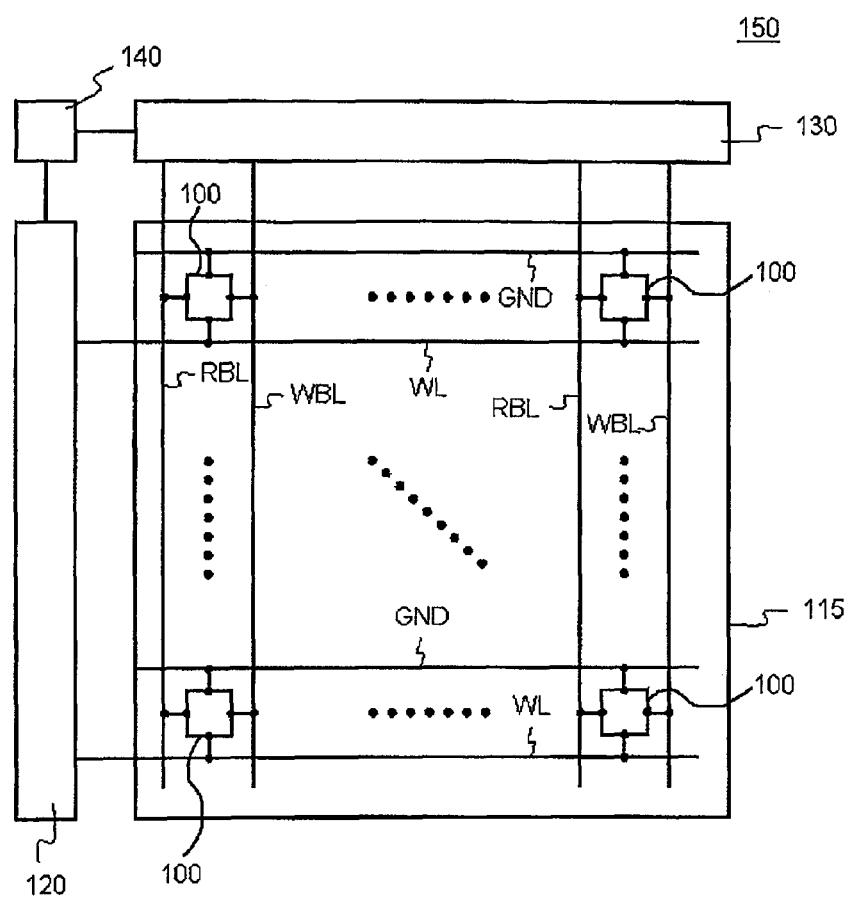
FIG. 18 is a block diagram illustrating an exemplary configuration of a magnetic memory device 150 according to the embodiment.

FIG. 18 is a block diagram illustrating an exemplary configuration of magnetic memory device 150 according to this embodiment. Magnetic memory 150 includes memory cell array 115, X driver 120, Y driver 130, and controller 140. Memory cell array 115 includes a plurality of magnetic memory cells 110 arranged in an array. Each of magnetic memory cells 110 includes above-mentioned magnetic memory element 100. As has been illustrated in FIG. 17, each magnetic memory cell 110 is connected to word line WL, ground line GND, and write bit line pair WBL, and read bit line RBL. X driver 120 is connected to a plurality of word lines WL, and drives a word line selected from among the plurality of word lines WL and connected to magnetic memory cell 110 to be accessed. Y driver 130 is connected to a plurality of write bit lines WBL and a plurality of read bit lines RBL, and sets each bit line to a state corresponding to data writing or data reading. Controller 140 controls X driver 120 and Y driver 130 in accordance with data writing or data reading.

Note that, the cell circuit diagram and the circuit block diagram illustrated in FIG. 17 and FIG. 18 are examples for realizing magnetic memory device 150 according to this embodiment. Other configurations can also be used to embody magnetic memory device 150 according to this embodiment.

(Materials)

A description is next given of materials used for the respective layers of magnetic memory element 100 according to this embodiment.

First free layer 11 and reference layer 21 are made of a ferromagnetic substance, and various kinds of materials containing, for example, Fe, Co, and Ni, may be used. Specifically, Fe, Co, Ni, Fe—Co, Fe—Ni, Fe—B, Co—B, Fe—Co—B, Fe—Ni—B, and the like are exemplified.

First non-magnetic layer 12, second non-magnetic layer 14, and third non-magnetic layer 22 are made of an insulator. Specifically, Si—O, Si—N, Al—O, Al—N, Mg—O, Hf—O, Ti—O, and the like are exemplified. The representation of Si—O as used herein means a compound of Si and O, and the other similar representations mean compounds.

Charged layer 13 is made of a material having a lower electric resistance than those of first non-magnetic layer 12 and second non-magnetic layer 14, and any kind of metal material may be used. Besides, charged layer 13 may be made of a material having semiconductor or insulating properties. Specifically, Al, Cu, Ti, Zr, Ta, W, Ru, Poly-Si, Si—N, Al—N, Ti—N, Zr—N, and the like are exemplified.

Injection layer 15 is made of a material having a lower electric resistance than that of second non-magnetic layer 14, and any kind of metal material can be used. Besides, injection layer 15 may be made of a material having semiconductor properties. Specifically, Al, Cu, Ti, Zr, Ta, W, Ru, Poly-Si, Al—N, Ti—N, Si, Ge, C, and the like are exemplified.

Magnetic memory element 100 according to this embodiment can be embodied by the following specific film structure, for example. Numerical values in parentheses denote the film thickness. The injection layer and the reference layer are each a multi-layer laminate film.

injection layer 15: Ta (1-10 nm)/Cu (1-30 nm)/Ta (1-10 nm)
second insulating layer 14: Si—O (0.5-3.0 nm)
charged layer 13: Cu (0.1-5 nm)
first insulating layer 12: Hf—O (1-10 nm)
first free layer 11: CoFeB (0.8-1.5 nm)
third insulating layer 22: MgO (0.5-3.0 nm)
reference layer 21: CoFeB (2 nm)/Ru (1 nm)/CoFe (2 nm)/PtMn (20 nm)

(Example)

Figure 19:
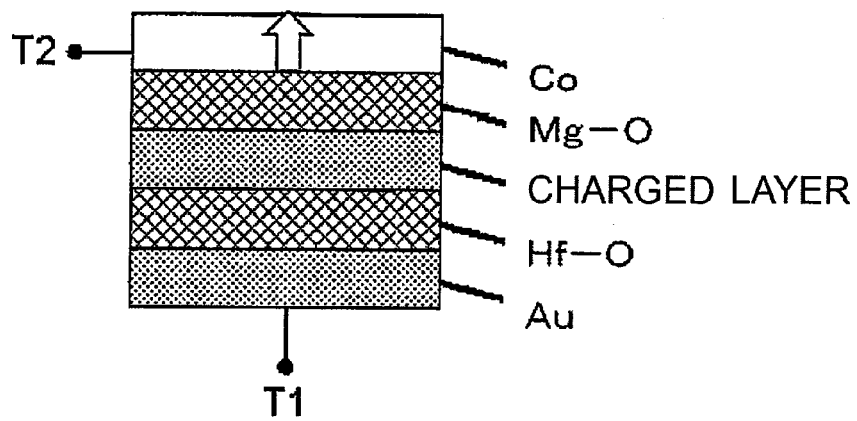
FIG. 19 is a cross-sectional diagram schematically illustrating the structure of a magnetic memory element according to an example of the embodiment.
Figure 20:
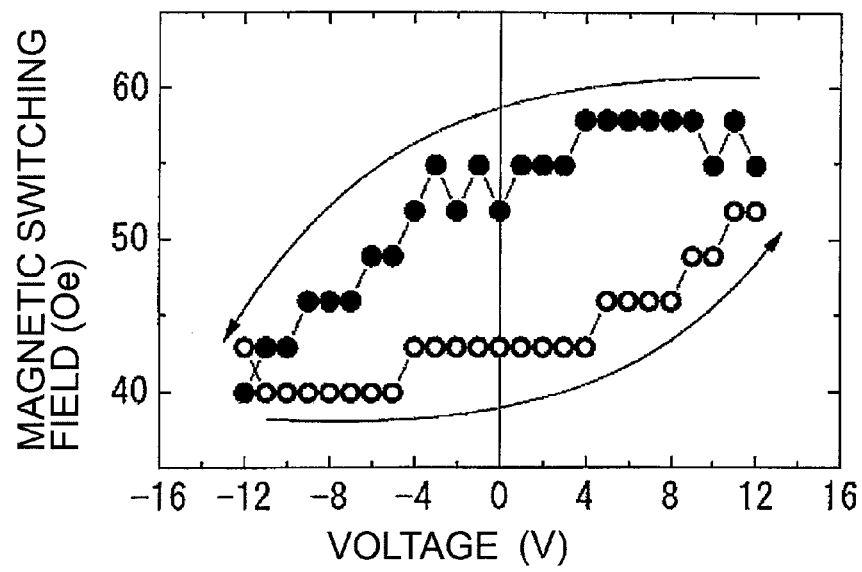
FIG. 20 shows the voltage dependency of a magnetic switching field of a first free layer (Co) of the magnetic memory element according to the example.

A description is now given of an example of magnetic memory element 100 according to this invention. FIG. 19 illustrates a film structure of magnetic memory element 100. In FIG. 19, the magnetic memory element includes a first free layer, a first insulating layer, a charged layer, a second insulating layer, and an injection layer in order from the top. A Mg—O film is used as the first insulating layer, a Hf—O film is used as the second insulating layer, and a Au film is used as the injection layer. FIG. 20 shows the dependency of a magnetic switching field of the first free layer (Co) on the voltage between T1 and T2 in this element. The voltage was swept from −12 V to +12 V and from +12 V to −12 V. The magnetic switching field differs between the case where the voltage was changed from −12 V to be off (0 V) and the case where the voltage was changed from +12 V to be off, which shows hysteresis characteristics. It is therefore confirmed that memory operation was executed.

(Effects)

A description is next given of effects obtained in this embodiment. The most distinctive feature of magnetic memory element 100 according to this embodiment resides in that writing is performed by a voltage, though the MRAM hitherto developed performs writing with the use of a current. Writing is performed based on the accumulation of electric charges into charged layer 13, and a current to be consumed in writing is vanishingly small. Consequently, writing can be performed with significantly small power consumption. On the other hand, the TMR effect is used in reading, and hence an access time comparable to that in the conventional MRAM can be realized. The magnetic memory device of the embodiment includes such a magnetic memory element, and hence a magnetic memory device having significantly low power consumption while maintaining a fast random access frequency can be provided.

MODIFIED EXAMPLES

Magentic memory element 100 described above can also be embodied by using modified examples described below.

First Modified Example

Figure 21:
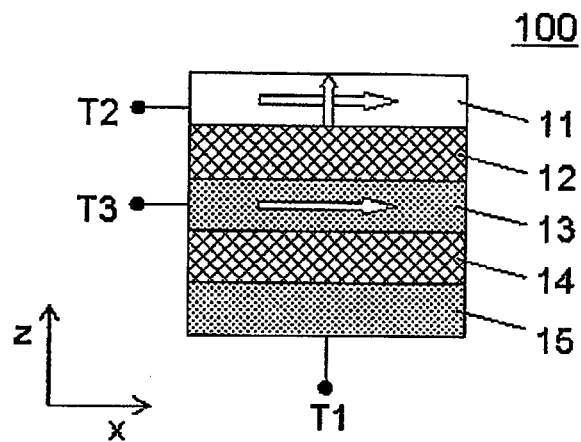
FIG. 21 schematically illustrates the structure of a magnetic memory element 100 according to a first modified example of the embodiment.

FIG. 21 schematically illustrates the structure of magnetic memory element 100 according to a first modified example of this embodiment. The first modified example relates to the structure of magnetic memory element 100.

As described above, magnetic memory element 100 according to this embodiment includes at least first free layer 11, first insulating layer 12, charged layer 13, second insulating layer 14, and injection layer 15, and, although not always required, reference layer 21 and third insulating layer 22 are preferably provided. However, reference layer 21 and third insulating layer 22 can be omitted. In magnetic memory element 100 according to the first modified example, reference layer 21 and third insulating layer 22 are omitted. Then, the function of reference layer 21 is accomplished by charged layer 13, and the function of third insulating layer 22 is accomplished by first insulating layer 12.

Magnetic memory element 100 illustrated in FIG. 21 is formed by laminating first free layer 11, first insulating layer 12, charged layer 13, second insulating layer 14, and injection layer 15 in this order. The descriptions of first free layer, second insulating layer, and injection layer 15 are omitted because the layers are the same as those described above with reference to FIG. 1. In the description with reference to FIG. 1, charged layer 13 is made of a material having a lower electric resistance than those of first insulating layer 12 and second insulating layer 13 to be described below. In the first modified example, however, in addition to this condition, charged layer 13 needs to be made of a ferromagnetic substance and has magnetization fixed in one direction. In other words, charged layer 13 in the first modified example has both the functions of charged layer 13 and reference layer 21 of FIG. 1. First insulating layer 11 is made of an insulating material. First insulating layer 11 in the first modified example has both the functions of first insulating layer 11 and third insulating layer 22 of FIG. 1.

According to the first modified example, the degree of freedom of design of charged layer 13 and first insulating layer 12 is narrowed because the function of reference layer 21 is absorbed in charged layer 13 and the function of third insulating layer 22 is absorbed in first insulating layer 12, but the structure is simplified because of the reduced number of necessary layers, which facilitates integration.

Second Modified Example

Figure 22:
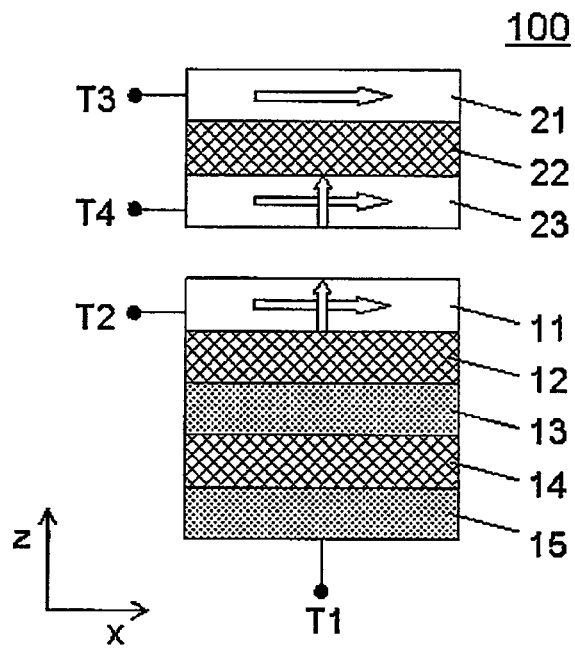
FIG. 22 schematically illustrates the structure of a magnetic memory element according to a second modified example (1) of the embodiment.

FIG. 22 schematically illustrates the structure of magnetic memory element 100 according to a second modified example of this embodiment. The second modified example relates to the structure of magnetic memory element 100.

Magnetic memory element 100 according to second modified example includes first free layer 11, first insulating layer 12, charged layer 13, second insulating layer 14, injection layer 15, reference layer 21, and third insulating layer 22, and further, second free layer 23 is provided. In FIG. 22, injection layer 15 is connected to first terminal Ti, first free layer 11 is connected to second terminal T2, reference layer 21 is connected to third terminal T3, and second free layer 23 is connected to fourth terminal T4. However, how the terminals are arranged for connection to an external circuit is not limited to the above. For example, the second terminal and the fourth terminal may be shared.

Second free layer 23 is made of a ferromagnetic substance, and has magnetization having a variable direction. The direction of magnetization of second free layer 23 changes depending on the direction of magnetization of first free layer 11. Second free layer 23 is provided adjacent to third non-magnetic layer 22 and on the side opposite to reference layer 21. In other words, an MTJ is formed by second free layer 23, third non-magnetic layer 22, and reference layer 21.

In the second modified example, the direction of magnetization of first free layer 11 changes depending on the presence/absence and sign of electric charges accumulated in charged layer 13. Then, the magnetization of second free layer 23 changes depending on the magnetization of first free layer 11, and finally, information is read by the MTJ including second free layer 23, third non-magnetic layer 22, and reference layer 21. Thus, first free layer 11 only needs to be designed so that its magnetization may easily change depending on a voltage. Second free layer 23, on the other hand, only needs to be designed so that a larger TMR ratio may be obtained. In this manner, according to the second modified example, the write and retention characteristics and the read characteristics can be designed independently of each other to improve the degree of freedom of design.

Figure 23:
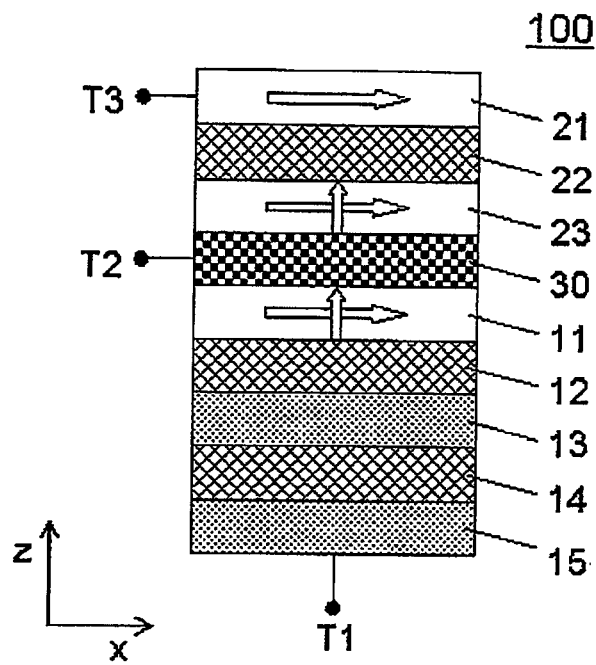
FIG. 23 schematically illustrates the structure of a magnetic memory element according to the second modified example (2) of the embodiment.

FIG. 23 is a schematic diagram illustrating the structure in another configuration of the second modified example. In FIG. 23, conductive layer 30 is provided between first free layer 11 and second free layer 23. Conductive layer 30 is connected to the second terminal for connection to an external circuit. In this manner, first free layer 11 and second free layer 23 may be electrically connected to each other. In this case, various kinds of metal materials can be used for conductive layer 30. For example, Cu, Ta, and the like are exemplified.

Alternatively, first free layer 11 and second free layer 23 may be magnetically coupled to each other via conductive layer 30. The magnetic coupling between first free layer 11 and second free layer 23 can be realized by using a material such as Ru for conductive layer 30.

Third Modified Example

Figure 24:
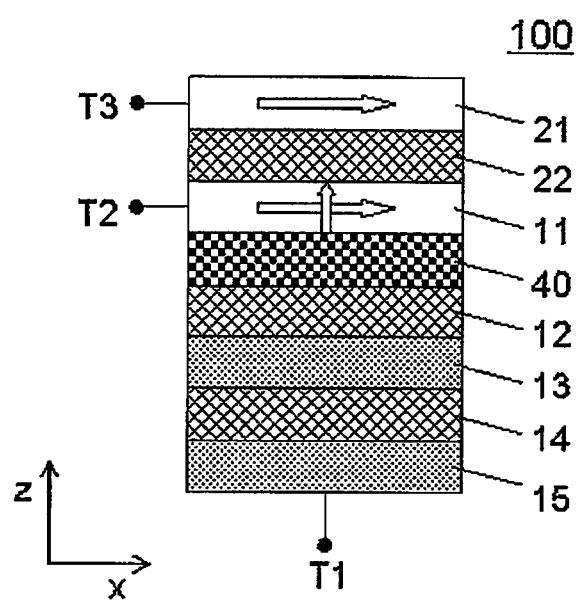
FIG. 24 schematically illustrates the structure of a magnetic memory element according to a third modified example of the embodiment.

FIG. 24 schematically illustrates the structure of magnetic memory element 100 according to a third modified example of this embodiment. The third modified example relates to the structure of magnetic memory element 100.

In magnetic memory element 100 according to the third modified example, insertion layer 40 is provided adjacent to first free layer 11. In FIG. 24, insertion layer 40 is arranged to be sandwiched by first free layer 11 and first insulating layer 12. Any kind of material can be used for insertion layer 40.

Insertion layer 40 is provided for the purpose of adjusting voltage characteristics of magnetic properties of first free layer 11. For example, Non Patent Literature 3 describes that the use of ultra-thin Pt as insertion layer 40 enables the magnetic properties of first free layer 11 to be greatly changed depending on a voltage.

Although first free layer 11 is connected to the second external terminal in FIG. 24, insertion layer 40 may be connected to the second terminal.

Fourth Modified Example

Figure 25:
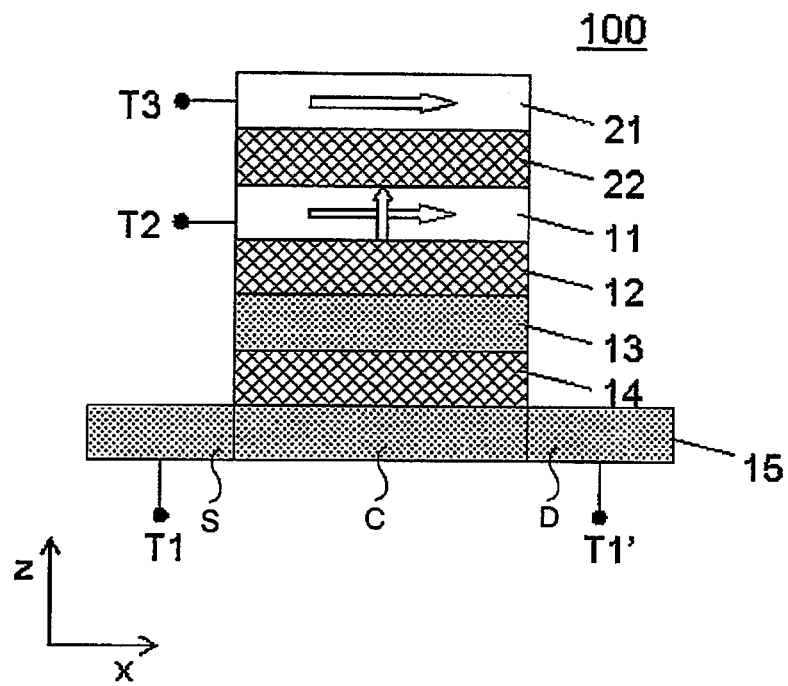
FIG. 25 schematically illustrates the structure of a magnetic memory element according to a fourth modified example of the embodiment.

FIG. 25 schematically illustrates the structure of magnetic memory element 100 according to a fourth modified example of this embodiment. The fourth modified example relates to a method of writing information into magnetic memory element 100.

According to the write methods described above with reference to FIGS. 14A and 14B and FIGS. 15A and 15B, writing is performed with the use of a tunnel current between injection layer 15, second insulating layer 14, and charged layer 13. However, an available method of writing information into magnetic memory element 100 according to this embodiment is not limited thereto.

As another method than the method using a tunnel current between injection layer 15, second insulating layer 14, and charged layer 13, FIG. 25 illustrates a method using hot electrons according to the fourth modified example. In the structure illustrated in FIG. 25, injection layer 15 includes three regions of source region S, channel region C, and drain region D, and source region S and drain region D are connected to first terminal Ti and auxiliary first terminal T1', respectively. In writing, for example, second terminal T2 and auxiliary first terminal T1' are set to High level to cause electrons to flow from source region S into drain region D via channel region C. The hot electrons at this time are accumulated in charged layer 13. In this manner, electric charges can be accumulated. Similarly, the charging of charged layer 13 can be erased through hot-hole injection as well.

The write method using hot electrons is used in a NOR flash memory, and is capable of high speed writing with a low voltage.

Fifth Modified Example

Figure 26:
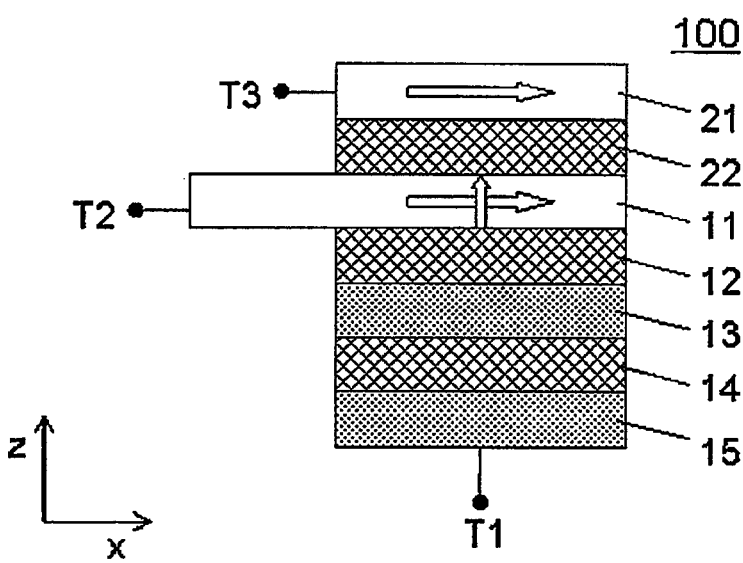
FIG. 26 schematically illustrates the structure of a magnetic memory element according to a fifth modified example (1) of the embodiment.
Figure 27:
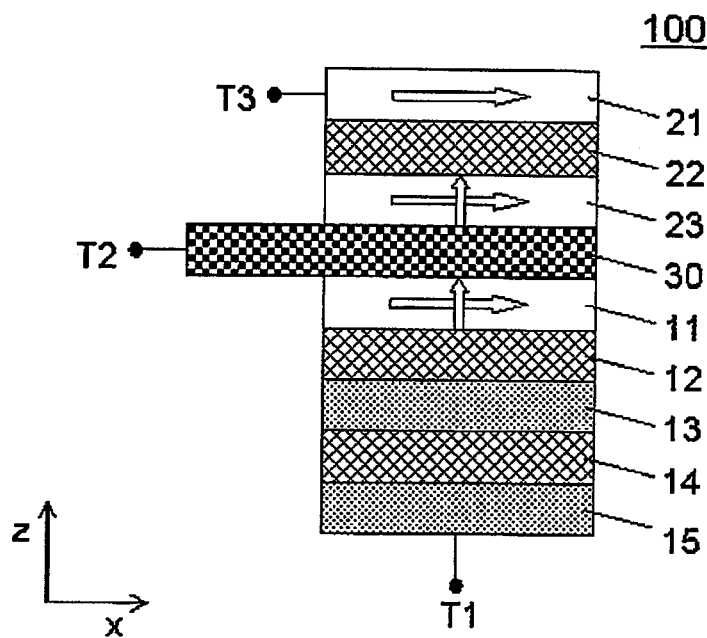
FIG. 27 schematically illustrates the structure of a magnetic memory element according to the fifth modified example (2) of the embodiment.
Figure 28:
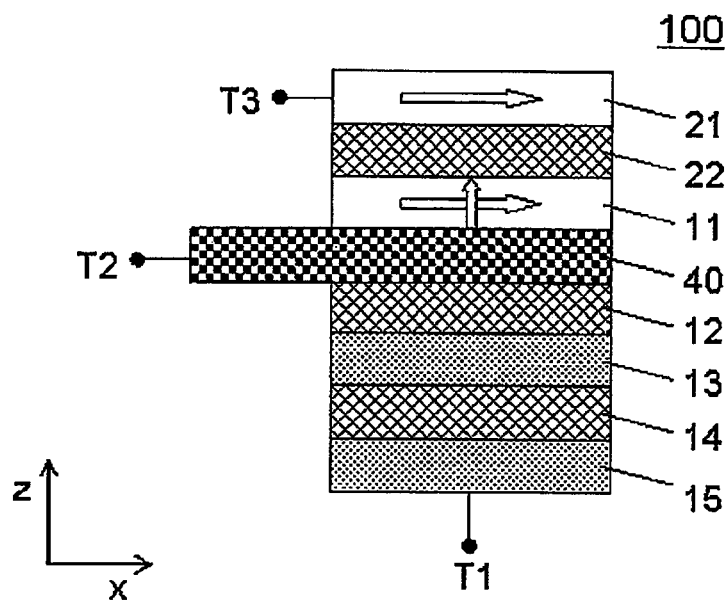
FIG. 28 schematically illustrates the structure of a magnetic memory element according to the fifth modified example (3) of the embodiment.

FIGS. 26 to 28 schematically illustrate the structures of magnetic memory element 100 according to a fifth modified example of this embodiment. The fifth modified example relates to how the terminals are arranged for magnetic memory element 100.

Magnetic memory element 100 according to this embodiment is typically a three-terminal element. Then, the respective layers may be provided to extend within the plane parallel to the substrate in order to be connected to the three terminals.

For example, as illustrated in FIG. 26, first free layer 11 may be provided to extend in the x direction to be connected to the second terminal. Alternatively, as illustrated in FIG. 27, conductive layer 30 may be provided to extend in the x direction to be connected to the second terminal. Still alternatively, as illustrated in FIG. 26, insertion layer 40 may be provided to extend in the x direction to be connected to the second terminal.

Sixth Modified Example

Figure 29:
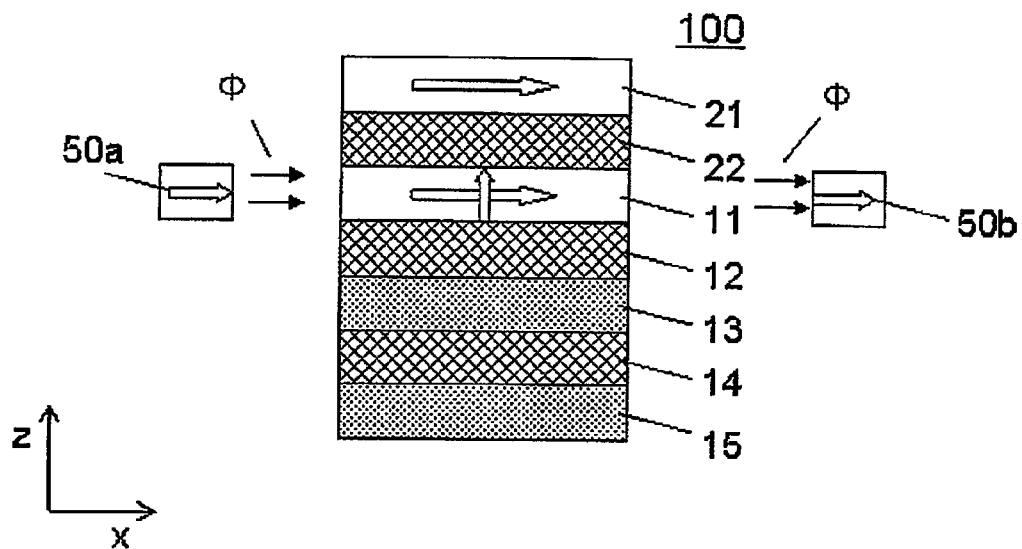
FIG. 29 schematically illustrates the structure of a magnetic memory element according to a sixth modified example (1) of the embodiment.
Figure 30:
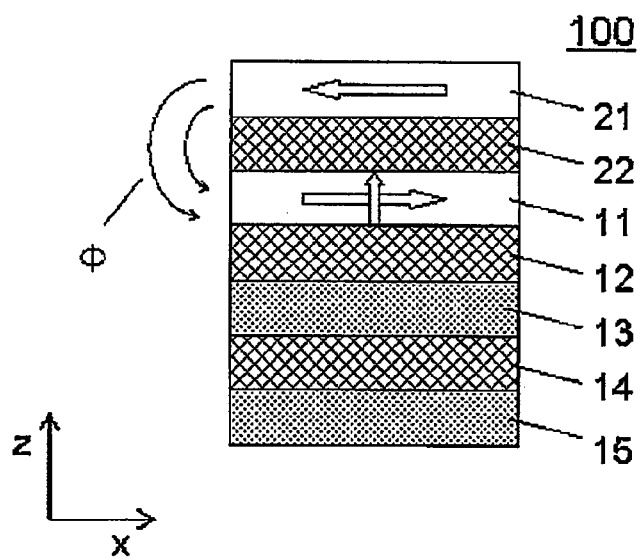
FIG. 30 schematically illustrates the structure of a magnetic memory element according to the sixth modified example (2) of the embodiment.
Figure 31:
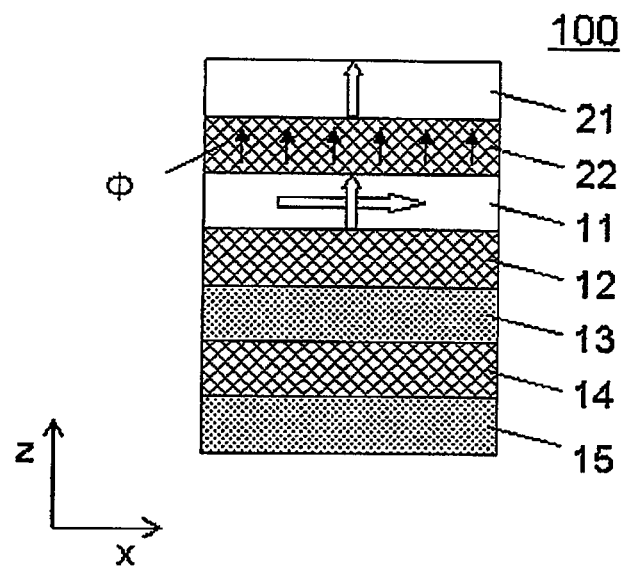
FIG. 31 schematically illustrates the structure of a magnetic memory element according to the sixth modified example (3) of the embodiment.

FIGS. 29 to 31 schematically illustrate the structures of a magnetic memory element 100 according to a sixth modified example of this embodiment. The sixth modified example relates to the structure of magnetic memory element 100.

In magnetic memory element 100 according to this embodiment, the presence/absence and sign of electric charges accumulated in charged layer 13 and the direction of magnetization of first free layer 11 corresponding thereto correspond to stored information. In reading, the direction of magnetization of first free layer 11 is read through the TMR effect in the MTJ including first free layer 11, third non-magnetic layer 22, and reference layer 21. Taking the case illustrated in FIGS. 10A and 10B as an example, in the "0" state of FIG. 10A, first free layer 11 has perpendicular magnetic anisotropy, and the MTJ has a perpendicular configuration of the magnetization directions. In the "1" state of FIG. 10B, on the other hand, first free layer 11 has in-plane magnetic anisotropy, and the MTJ has a parallel configuration of the magnetization directions. In this example, in the case of the "1" state of FIG. 10B, first free layer 11 has in-plane magnetic anisotropy, but the magnetization is not always oriented in the +x direction. When the magnetization direction of first free layer 11 deviates from the +x direction, the MTJ deviates from the parallel configuration and the MTJ resistance therefore increases. In the sixth modified example, in order to prevent such a defect, magnetic memory element 100 is designed so that a magnetic flux φ may be applied to first free layer 11.

In magnetic memory element 100 illustrated in FIG. 29, bias layer 50 is provided for applying a magnetic flux φ. Particularly in the example illustrated in FIG. 29, first bias layer 50a and second bias layer 50b are provided in the vicinity of first free layer 11. First bias layer 50a and second bias layer 50b are magnetized in the +x direction, and a magnetic flux φ in the +x direction is applied to first free layer 11. In this case, the magnetization of first free layer 11 is oriented in the +x direction when first free layer 11 becomes the in-plane magnetic anisotropic state, and the parallel configuration of the MTJ including first free layer 11, third non-magnetic layer 22, and reference layer 21 can be stably generated. Bias layer 50 in the example of FIG. 29 is made of an in-plane magnetic anisotropic material, but bias layer 50 may be realized by using a perpendicular magnetic anisotropic material to shift the height in the z direction. Alternatively, bias layer 50 may be used to generate a magnetic flux φ in the +z direction at the position of first free layer 11.

FIG. 30 illustrates an example in which a leakage magnetic flux (I) from reference layer 21 is applied to first free layer 11. By designing magnetic memory element 100 so that the fixed magnetization of reference layer 21 may be oriented in the −x direction and the leakage magnetic flux φ in the +x direction at the position of first free layer 11 may become larger, the magnetization of first free layer 11 is oriented in the +x direction when first free layer 11 becomes the in-plane magnetic anisotropic state. Consequently, the anti-parallel configuration of the MTJ including first free layer 11, third non-magnetic layer 22, and reference layer 21 can be stably generated.

FIG. 31 illustrates an example in which the magnetization of reference layer 21 is fixed in the +z direction and a leakage magnetic flux φ in the +z direction is generated at the position of first free layer 11. In this case, the magnetization of first free layer 11 is oriented in the +z direction when first free layer 11 becomes the perpendicular magnetic anisotropic state. Consequently, the parallel configuration of the MTJ including first free layer 11, third non-magnetic layer 22, and reference layer 21 can be stably generated.

Seventh Modified Example

FIG. 32, and FIGS. 33A and 33B to 35A and 35B schematically illustrate the structures of magnetic memory element 100 according to a seventh modified example of this embodiment. The seventh modified example relates to a domain structure of first free layer 11.

Although first free layer 11 is illustrated as having a single domain structure in the foregoing explanatory diagrams, first free layer 11 may have a multi-domain structure in practice, and a preferred effect can also be obtained owing to the multi-domain structure. FIG. 32 and FIGS. 33A and 33B to 35A and 35B illustrate the specific examples.

Figure 32:
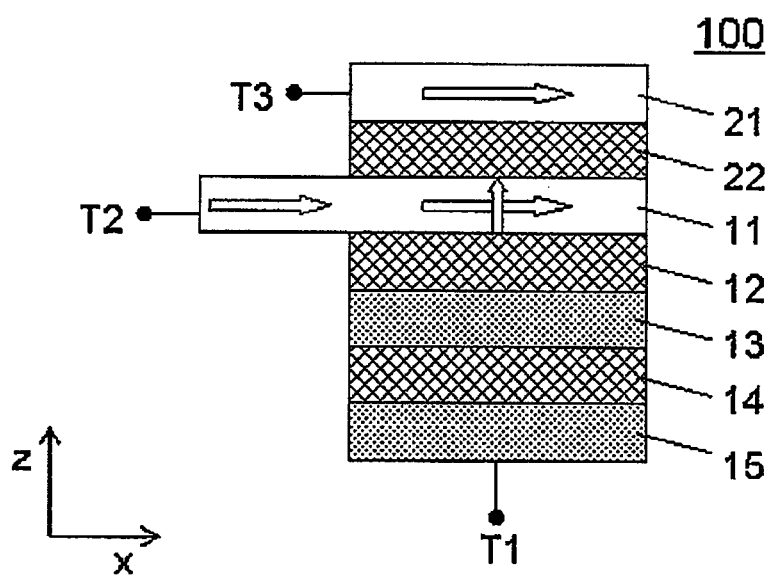
FIG. 32 schematically illustrates the structure of a magnetic memory element according to a seventh modified example (1) of the embodiment.
Figure 33A:
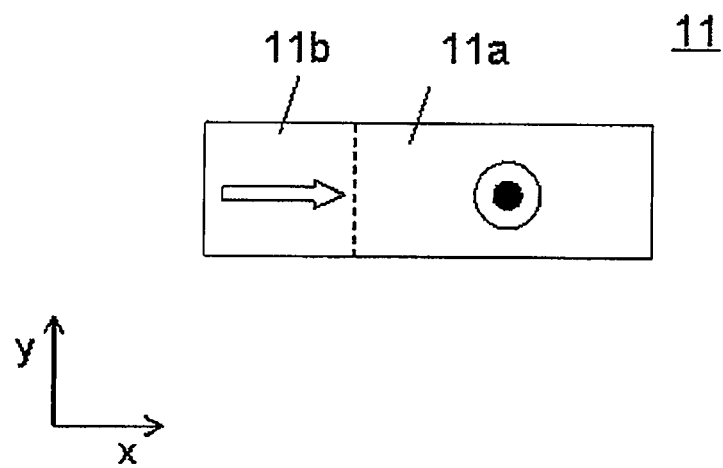
FIG. 33A is an x-y plan view illustrating a domain structure of a first free layer 11 in a memory state "0" of the magnetic memory element according to the seventh modified example (1) of the embodiment.
Figure 33B:
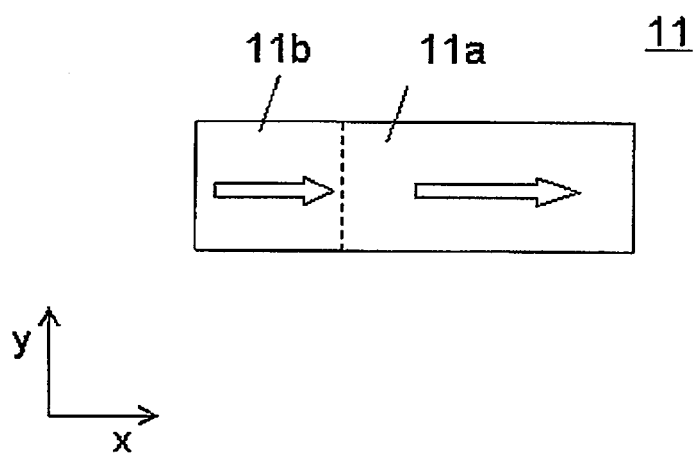
FIG. 33B is an x-y plan view illustrating a domain structure of the first free layer 11 in a memory state "1" of the magnetic memory element according to the seventh modified example (1) of the embodiment.

In FIG. 32, first free layer 11 is provided to extend in the x direction. FIGS. 33A and 33B are x-y plan views illustrating the domain structure of first free layer 11. FIG. 33A illustrates the domain structure of first free layer 11 in the "0" state, and FIG. 33B illustrates the domain structure of first free layer 11 in the "1" state. As illustrated in FIGS. 33A and 33B, first free layer 11 includes first region 11a and second region 11b. First region 11a has a magnetization direction variable depending on the memory state, and the second region has magnetization fixed in the +x direction. When electric charges are accumulated in charged layer 13, the magnetization of first region 11a is oriented in the +z direction due to the electric field formed (FIG. 33A). On the other hand, when the electric charges of charged layer 13 are discharged so that the electric field becomes zero, the magnetization of first region 11a is oriented in the +x direction due to the coupling with the second region 11b. In this manner, also when first free layer 11 has the domain structure, the same effect as that described in the sixth modified example can be obtained.

Figure 34:
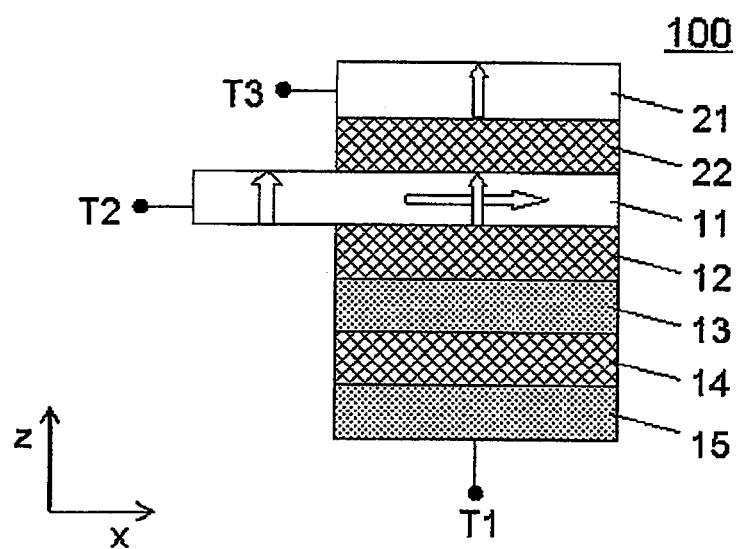
FIG. 34 schematically illustrates the structure of a magnetic memory element according to the seventh modified example (2) of the embodiment.
Figure 35A:
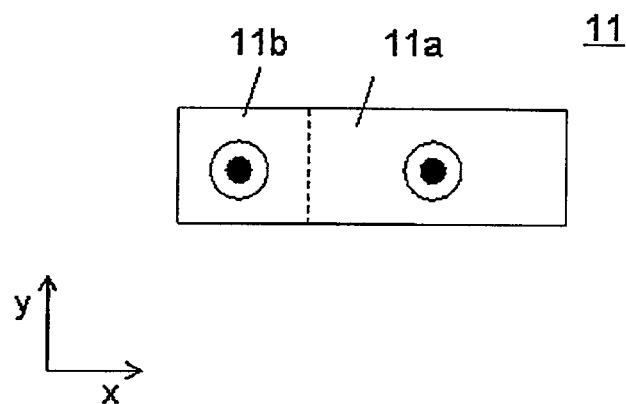
FIG. 35A is an x-y plan view illustrating a domain structure of a first free layer 11 in a memory state "0" of the magnetic memory element according to the seventh modified example (2) of the embodiment.
Figure 35B:
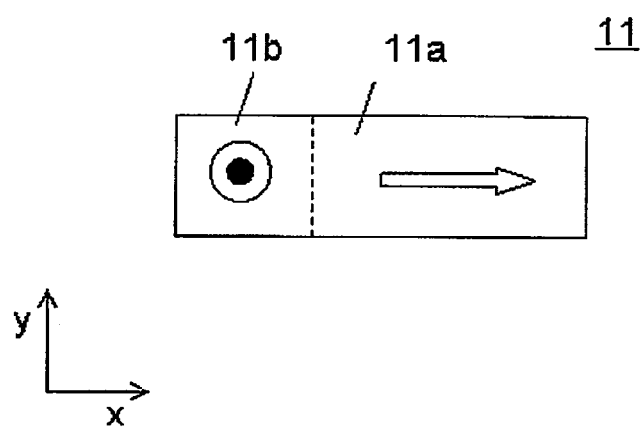
FIG. 35B is an x-y plan view illustrating a domain structure of the first free layer 11 in a memory state "1" of the magnetic memory element according to the seventh modified example (2) of the embodiment.
Figure 36A:
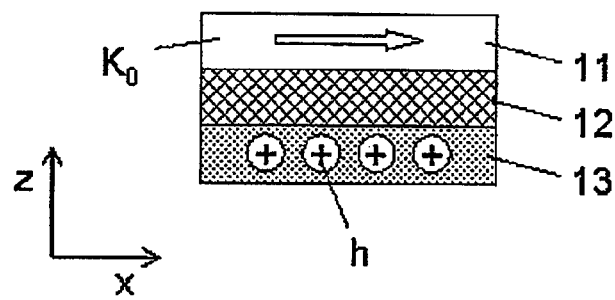
FIG. 36A illustrates a part of a NOR logic according to another embodiment of this invention.
Figure 36B:
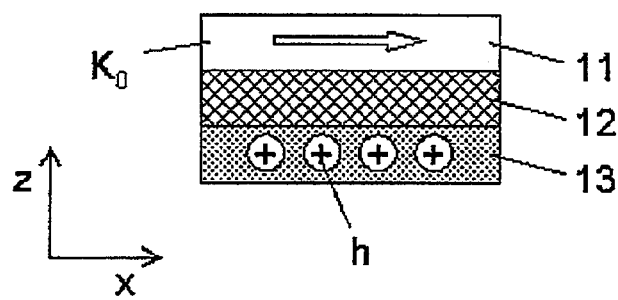
FIG. 36B illustrates a part of a NOR logic according to another embodiment of this invention.
Figure 36C:
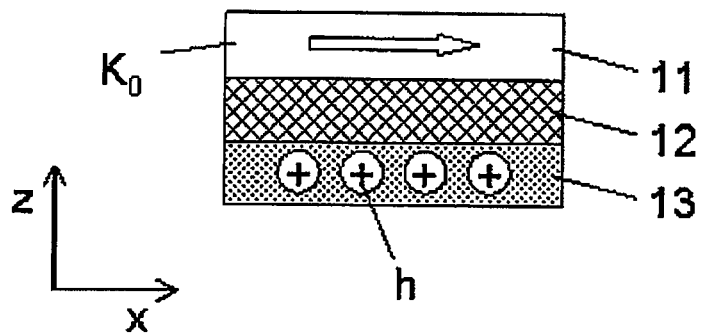
FIG. 36C illustrates a part of a NOR logic according to another embodiment of this invention.
Figure 36D:
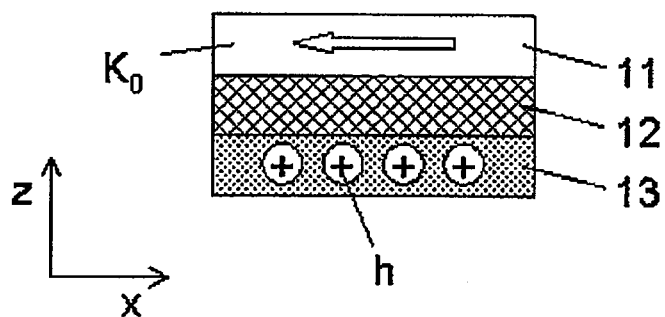
FIG. 36D illustrates a part of a NOR logic according to another embodiment of this invention.
Figure 37A:
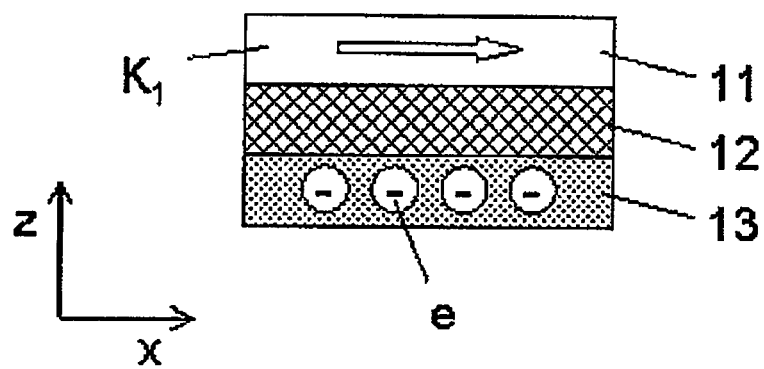
FIG. 37A illustrates a part of a NAND logic according to another embodiment of this invention.
Figure 37B:
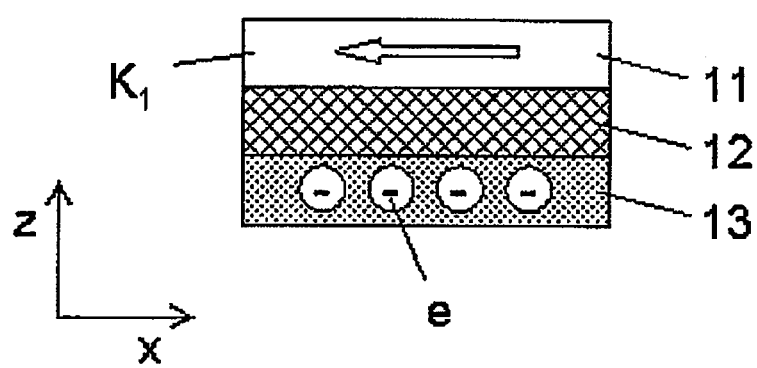
FIG. 37B illustrates a part of a NAND logic according to another embodiment of this invention.
Figure 37C:
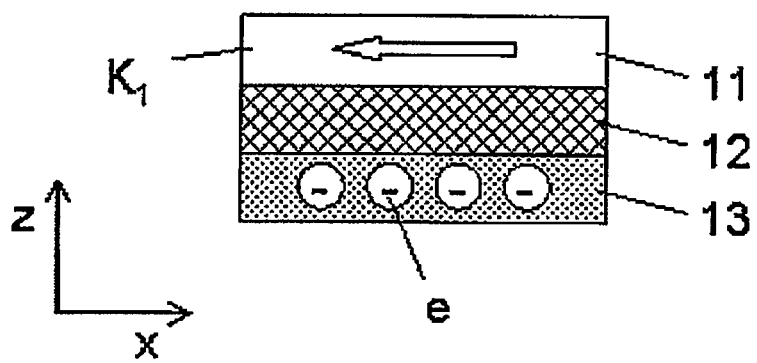
FIG. 37C illustrates a part of a NAND logic according to another embodiment of this invention.
Figure 37D:
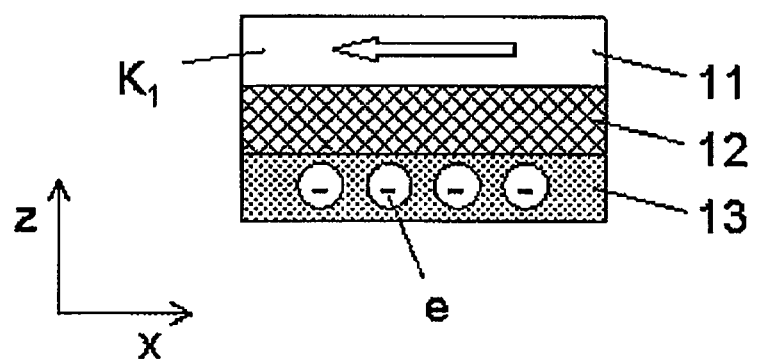
FIG. 37D illustrates a part of a NAND logic according to another embodiment of this invention.

FIGS. 34, 35A, and 35B illustrate another configuration of the seventh modified example. FIG. 34 illustrates a cross-sectional diagram, and FIGS. 35A and 35B illustrate plan views in the respective memory states. In FIGS. 34, 35A, and 35B, first region 11a has a variable magnetization while the magnetization of second region is fixed in the +z direction. In this case, for example, when it is assumed that first free layer 11 is imparted with perpendicular magnetic anisotropy when an electric field is applied to first free layer 11, the magnetization of first region 11a is oriented in any one of the +z and −z directions. If first free layer 11 is designed so that energy may increase when a domain wall is provided in first free layer 11, first free layer 11 refuses to introduce a domain wall, and hence the magnetization of first region 11a is oriented in the +z direction. On the other hand, if first free layer 11 is designed so that it may be advantageous for first free layer 11 to have a domain wall in terms of energy, the magnetization of first region 11a is oriented in the −z direction. In this manner, by providing second region 11b in which the magnetization direction is not changed by a voltage in first free layer 11, it becomes possible to control the stable direction of the magnetization of first region 11a in relation to the magnetization configuration of the MTJ to be realized.

Other Embodiments

The principle used in magnetic memory element 100 described above is applicable also to a logic circuit. The outline is now described with reference to FIG. 1 and FIGS. 36A to 36D and 37A to 37D illustrating magnetic logic elements.

In a logic circuit, a certain operation is performed on a single or a plurality of inputs to obtain one output. For example, in the case of a NAND operation for two inputs, the output becomes "0" only when the two inputs are "1" and "1", and "1" is output in the other combinations of the inputs. In the case of a NOR operation, the output becomes "1" only when the two inputs are "0" and "0", and "0" is output in the other combinations. The logic configuration in such cases is stored in an SRAM, and hence a nonvolatile memory such as a flash memory needs to be additionally provided in order to retain the configuration information during power-off. The application of the principle used in this embodiment can provide a nonvolatile logic circuit capable of retaining a logic configuration in a nonvolatile manner without additionally providing such a nonvolatile memory.

Referring to FIG. 1, a description has been given of how the magnetic anisotropy of first free layer 11 changes depending on the presence/absence and sign of electric charges accumulated in charged layer 13. Now, the case where two input signals (first input and second input) are input to first free layer 11 is considered. The magnetic anisotropy of first free layer 11 in the "0" state in which positive electric charges are accumulated in charged layer 13 becomes $K_0$ (FIGS. 36A to 36D), and the magnetic anisotropy of first free layer 11 in the "1" state in which negative electric charges are accumulated in charged layer 13 becomes $K_1$ (FIGS. 37A to 37D). In the case where the magnetic anisotropy of first free layer 11 is $K_0$, the magnetization of first free layer 11 is oriented in the −x direction only when the first input and the second input are both "1", and the magnetization of first free layer 11 is oriented in the +x direction in the other combinations of the inputs (FIGS. 36A to 36D). Similarly, in the case where the magnetic anisotropy of first free layer 11 is $K_1$, the magnetization of first free layer 11 is oriented in the +x direction only when the first input and the second input are both "0", and the magnetization of first free layer 11 is oriented in the −x direction in the other combinations of the inputs (FIGS. 37A to 37D). In this case, it is understood that, by designing the magnetization direction of reference layer 21 so that "1" may be output in the state in which the magnetization of first free layer 11 is oriented in the +x direction while "0" may be output in the state in which the magnetization of first free layer 11 is oriented in the −x direction, a NOR operation is realized in the former case (FIGS. 36A to 36D) and a NAND operation is realized in the latter case (FIGS. 37A to 37D). Then, the logical configuration information is accumulated as the charge in charged layer 13, and is therefore retained in a nonvolatile manner.

Specific configurations of the first input and the second input and how the inside of first free layer 11 responds to those inputs may be variously employed. As an exemplary configuration, the first input and the second input may be the Oersted magnetic field induced by a current flowing through wiring, and the magnetization within first free layer 11 may be switched with respect to the magnetic field. Alternatively, the first input and the second input may be a current directly introduced into first free layer 11, and the magnetization switching may occur in first free layer 11 due to spin-transfer torque induced by the current. The magnetization switching caused by the magnetic field and the magnetization switching caused by the spin-transfer torque are both affected by the state of the magnetic anisotropy of first free layer 11.

In the above-mentioned embodiment, a description has been given of the magnetic memory device and the logic circuit each including the nonvolatile magnetic element. The magnetic memory device and the logic circuit are one configuration of the nonvolatile magnetic device, which includes the nonvolatile magnetic element including the first free layer made of a ferromagnetic substance, the first insulating layer made of an insulator and provided to be connected to the first free layer, the charged layer provided adjacent to the first insulating layer, the second insulating layer made of an insulator and provided adjacent to the charged layer, and the injection layer provided adjacent to the second insulating layer, in which the charged layer is smaller in electric resistivity than both of the first insulating layer and the second insulating layer, and the injection layer is smaller in electric resistivity than the second insulating layer.

It should be understood that this invention is not limited to the above-mentioned embodiment and modified examples and may be appropriately changed within the range of the technical concept of this invention.

INDUSTRIAL APPLICABILITY

Application examples of this invention include a nonvolatile semiconductor memory device and an arithmetic logic unit to be used for a mobile phone, a mobile personal computer, and a PDA, and a nonvolatile memory and a microcomputer incorporating an arithmetic logic unit to be used for an automobile or the like.

This application claims priority from Japanese Patent Application No. 2011-133897, filed on Jun. 16, 2011, the entire disclosure of which is incorporated herein.

REFERENCE SIGNS LIST 11 first free layer
12 first insulating layer
13 charged layer
14 second insulating layer
15 injection layer
21 reference layer
22 third insulating layer
23 second free layer
30 conductive layer
40 insertion layer
50a first bias layer
50b second bias layer
100 magnetic memory element
110 magnetic memory cell 120 X driver
130 Y driver
150 magnetic memory device
T1 first terminal
T2 second terminal
T3 third terminal
T4 fourth terminal

The invention claimed is:

1. A nonvolatile magnetic element, comprising:
a first insulating layer comprising an insulator;
a first free layer comprising a ferromagnetic substance, the first free layer being formed on one side of the first insulating layer;
a charged layer for accumulating an electric charge, the charged layer being formed on another side of the first insulating layer and opposed to the first free layer;
a second insulating layer comprising an insulator, the second insulating layer being formed on one side of the charged layer and opposed to the first insulating layer; and
an injection layer formed on one side of the second insulating layer and opposed to the charged layer,
wherein the charged layer is smaller in electric resistivity than both of the first insulating layer and the second insulating layer, and
wherein the injection layer is smaller in electric resistivity than the second insulating layer.

2. A nonvolatile magnetic element according to claim 1, further comprising:
a third insulating layer comprising an insulator; and
a reference layer comprising a ferromagnetic substance, the reference layer being formed on one side of the third insulating layer,
wherein the reference layer and the first free layer are arranged on opposite sides with respect to the third insulating layer.

3. A nonvolatile magnetic element according to claim 1,
wherein the injection layer is connected to a first terminal,
wherein the first free layer is connected to a second terminal, and
wherein any one of the reference layer and the charged layer is connected to a third terminal.

4. A nonvolatile magnetic element according to claim 1, further comprising an insertion layer formed between the first free layer and the first insulating layer, the insertion layer being capable of adjusting a voltage characteristic of magnetic property of the first free layer.

5. A nonvolatile magnetic element according to claim 1, wherein the first free layer comprises a first region having a variable magnetization direction and a second region having a fixed magnetization direction.

6. A nonvolatile magnetic element according to claim 1, wherein the injection layer comprises a source region, a channel region, and a drain region.

7. A nonvolatile magnetic element according to claim 1, wherein the charged layer comprises a ferromagnetic substance, and has magnetization having a fixed direction.

8. A nonvolatile magnetic element according to claim 2, further comprising a second free layer formed on another side of the third insulating layer and opposed to the reference layer.

9. A nonvolatile magnetic element according to claim 8, further comprising a conductive layer formed between the first free layer and the second free layer.

10. A nonvolatile magnetic element according to claim 1, further comprising a bias layer comprising a ferromagnetic substance, for applying a magnetic flux to the first free layer.

11. A nonvolatile magnetic element according to claim 1, wherein the nonvolatile magnetic element comprises a nonvolatile magnetic memory element.

12. A nonvolatile magnetic device, comprising the nonvolatile magnetic element according to claim 1.

13. A nonvolatile magnetic device according to claim 12, wherein the nonvolatile magnetic device comprises a magnetic memory device.

14. A nonvolatile magnetic element according to claim 1, wherein the nonvolatile magnetic element comprises a magnetic logic element.

15. A nonvolatile magnetic device, comprising the nonvolatile magnetic element according to claim 14.

16. A nonvolatile magnetic device according to claim 15, wherein the nonvolatile magnetic device comprises a logic circuit.

17. A nonvolatile magnetic element according to claim 2,
wherein the injection layer is connected to a first terminal,
wherein the first free layer is connected to a second terminal, and
wherein any one of the reference layer and the charged layer is connected to a third terminal.

18. A nonvolatile magnetic element according to claim 2, further comprising an insertion layer formed between the first free layer and the first insulating layer, the insertion layer being capable of adjusting a voltage characteristic of magnetic property of the first free layer.

19. A nonvolatile magnetic element according to claim 3, further comprising an insertion layer formed between the first free layer and the first insulating layer, the insertion layer being capable of adjusting a voltage characteristic of magnetic property of the first free layer.

20. A nonvolatile magnetic element according to claim 2, wherein the first free layer comprises a first region having a variable magnetization direction and a second region having a fixed magnetization direction.

* * * * *